(12) United States Patent  (10) Patent No.: US 9,425,151 B2
Golda et al.  (45) Date of Patent: Aug. 23, 2016

(54) COMPLIANT ELECTROSTATIC TRANSFER HEAD WITH SPRING SUPPORT LAYER

(71) Applicant: LuxVue Technology Corporation, Santa Clara, CA (US)

(72) Inventors: Dariusz Golda, Redwood City, CA (US); Stephen P. Bathurst, Lafayette, CA (US); John A. Higginson, Santa Clara, CA (US); Andreas Bibl, Los Altos, CA (US); Jeffrey Birkmeyer, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/307,325

(22) Filed: Jun. 17, 2014

(65) Prior Publication Data

US 2015/0364424 A1    Dec. 17, 2015

(51) Int. Cl.
*H01L 21/768* (2006.01)
*H01L 23/538* (2006.01)
*H01L 23/00* (2006.01)

(52) U.S. Cl.
CPC ...... *H01L 23/5384* (2013.01); *H01L 21/76898* (2013.01); *H01L 24/75* (2013.01); *H01L 24/95* (2013.01)

(58) Field of Classification Search
CPC ............ H01L 24/75; H01L 2224/7598; H01L 2924/1461; H01L 24/95; H01L 2224/75725; H01L 2924/12041; H01L 21/76898; B81C 99/002
USPC ............. 257/619, 623, 774, E29.324; 438/39
See application file for complete search history.

(56) References Cited

U.S. PATENT DOCUMENTS

| 3,717,743 | A |   | 2/1973 | Costello |
|---|---|---|---|---|
| 3,935,986 | A |   | 2/1976 | Lattari et al. |
| 5,131,582 | A |   | 7/1992 | Kaplan et al. |
| 5,378,926 | A |   | 1/1995 | Chi et al. |
| 5,435,857 | A |   | 7/1995 | Han et al. |
| 5,592,358 | A | * | 1/1997 | Shamouilian et al. ........ 361/234 |

(Continued)

FOREIGN PATENT DOCUMENTS

| JP | 07-060675 A | 3/1995 |
|---|---|---|
| JP | 11-142878 | 5/1999 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Thomas L Dickey
*Assistant Examiner* — Changhyun Yi
(74) *Attorney, Agent, or Firm* — Blakely, Sokoloff, Taylor & Zafman LLP

(57) ABSTRACT

A compliant electrostatic transfer head and method of forming a compliant electrostatic transfer head are described. In an embodiment, a compliant electrostatic transfer head includes a cavity in a base substrate, a spring support layer on the base substrate, and a patterned device layer on the spring support layer. The spring support layer includes a spring support layer beam profile that extends over and is deflectable toward the cavity, and the patterned device layer includes an electrode beam profile that is supported by the spring support layer beam profile and extends over and is deflectable toward the cavity.

20 Claims, 23 Drawing Sheets

(56) References Cited

U.S. PATENT DOCUMENTS

| | | |
|---|---|---|
| 5,740,956 A | 4/1998 | Seo et al. |
| 5,794,839 A | 8/1998 | Kimura et al. |
| 5,839,187 A | 11/1998 | Sato et al. |
| 5,851,664 A | 12/1998 | Bennett et al. |
| 5,888,847 A | 3/1999 | Rostoker et al. |
| 5,903,428 A | 5/1999 | Grimard et al. |
| 5,996,218 A | 12/1999 | Shamouilian et al. |
| 6,071,795 A | 6/2000 | Cheung et al. |
| 6,080,650 A | 6/2000 | Edwards |
| 6,081,414 A | 6/2000 | Flanigan et al. |
| 6,335,263 B1 | 1/2002 | Cheung et al. |
| 6,403,985 B1 | 6/2002 | Fan et al. |
| 6,420,242 B1 | 7/2002 | Cheung et al. |
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,683,368 B1 | 1/2004 | Mostafazadeh |
| 6,786,390 B2 | 9/2004 | Yang et al. |
| 6,878,607 B2 | 4/2005 | Inoue et al. |
| 6,918,530 B2 | 7/2005 | Shinkai et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,439,549 B2 | 10/2008 | Marchl et al. |
| 7,585,703 B2 | 9/2009 | Matsumura et al. |
| 7,628,309 B1 | 12/2009 | Erikssen et al. |
| 7,714,336 B2 | 5/2010 | Imai |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,854,365 B2 | 12/2010 | Li et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,076,670 B2 | 12/2011 | Slater et al. |
| 8,186,568 B2 | 5/2012 | Coronel et al. |
| 8,333,860 B1 | 12/2012 | Bibl et al. |
| 8,349,116 B1 | 1/2013 | Bibl et al. |
| 8,415,767 B1* | 4/2013 | Golda ............... B81C 99/002 257/619 |
| 8,415,768 B1* | 4/2013 | Golda et al. ............... 257/619 |
| 8,426,227 B1 | 4/2013 | Bibl et al. |
| 8,518,204 B2 | 8/2013 | Hu et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0100164 A1 | 5/2004 | Murata et al. |
| 2004/0232439 A1 | 11/2004 | Gibb et al. |
| 2004/0266048 A1 | 12/2004 | Platt et al. |
| 2005/0224822 A1 | 10/2005 | Liu |
| 2005/0232728 A1 | 10/2005 | Rice et al. |
| 2006/0038291 A1 | 2/2006 | Chung et al. |
| 2006/0055035 A1 | 3/2006 | Lin et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2007/0284604 A1 | 12/2007 | Slater et al. |
| 2008/0048206 A1 | 2/2008 | Lee et al. |
| 2008/0048520 A1* | 2/2008 | Gulvin et al. ............... 310/309 |
| 2008/0150134 A1 | 6/2008 | Shinkai et al. |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0205027 A1 | 8/2008 | Coronel et al. |
| 2008/0283190 A1 | 11/2008 | Papworth et al. |
| 2008/0283849 A1 | 11/2008 | Imai |
| 2008/0303038 A1 | 12/2008 | Grotsch et al. |
| 2009/0068774 A1 | 3/2009 | Slater et al. |
| 2009/0072382 A1 | 3/2009 | Guzek |
| 2009/0146303 A1 | 6/2009 | Kwon |
| 2009/0242918 A1 | 10/2009 | Edmond et al. |
| 2009/0303713 A1 | 12/2009 | Chang et al. |
| 2009/0314991 A1 | 12/2009 | Cho et al. |
| 2010/0052004 A1 | 3/2010 | Slater et al. |
| 2010/0105172 A1 | 4/2010 | Li et al. |
| 2010/0123164 A1 | 5/2010 | Suehiro et al. |
| 2010/0176415 A1 | 7/2010 | Lee et al. |
| 2010/0188794 A1 | 7/2010 | Park et al. |
| 2010/0200884 A1 | 8/2010 | Lee et al. |
| 2010/0203659 A1 | 8/2010 | Akaike et al. |
| 2010/0203661 A1 | 8/2010 | Hodota |
| 2010/0213471 A1 | 8/2010 | Fukasawa et al. |
| 2010/0214777 A1 | 8/2010 | Suehiro et al. |
| 2010/0248484 A1 | 9/2010 | Bower et al. |
| 2010/0276726 A1 | 11/2010 | Cho et al. |
| 2011/0001145 A1 | 1/2011 | Park |
| 2011/0003410 A1 | 1/2011 | Tsay et al. |
| 2011/0049540 A1 | 3/2011 | Wang et al. |
| 2011/0132655 A1 | 6/2011 | Horiguchi et al. |
| 2011/0132656 A1 | 6/2011 | Horiguchi et al. |
| 2011/0143467 A1 | 6/2011 | Xiong et al. |
| 2011/0147760 A1 | 6/2011 | Ogihara et al. |
| 2011/0151602 A1 | 6/2011 | Speier |
| 2011/0159615 A1 | 6/2011 | Lai |
| 2011/0210357 A1 | 9/2011 | Kaiser et al. |
| 2011/0244611 A1 | 10/2011 | Kim |
| 2011/0291134 A1 | 12/2011 | Kang |
| 2011/0297914 A1 | 12/2011 | Zheng et al. |
| 2011/0312131 A1 | 12/2011 | Renavikar et al. |
| 2012/0018494 A1 | 1/2012 | Jang et al. |
| 2012/0064642 A1 | 3/2012 | Huang et al. |
| 2012/0134065 A1 | 5/2012 | Furuya et al. |
| 2013/0019996 A1 | 1/2013 | Routledge |
| 2013/0038416 A1 | 2/2013 | Arai et al. |
| 2013/0130440 A1 | 5/2013 | Hu et al. |
| 2013/0134591 A1 | 5/2013 | Sakamoto et al. |
| 2013/0161682 A1 | 6/2013 | Liang et al. |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-161212 A | 7/2010 |
| JP | 2010-186829 A | 8/2010 |
| JP | 2011-181834 A | 9/2011 |
| KR | 10-0610632 B1 | 8/2006 |
| KR | 10-2007-0042214 A | 4/2007 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Elec-

(56) References Cited

OTHER PUBLICATIONS tronic Components and Technology Conference, pp. 1339-1343.
"Characteristics of electrostatic Chuck(ESC)" Advanced Materials Research Group, New Technology Research Laboratory, 2000, pp. 51-53 accessed at http://www.socnb.com/report/ptech_e/2000p51_e.pdf.
Guerre, Roland, et al, "Selective Transfer Technology for Microdevice Distribution" Journal of Microelectromechanical Systems, vol. 17, No. 1, Feb. 2008, pp. 157-165.
Han, Min-Koo, "AM backplane for AMOLED" Proc. of ASID '06, Oct. 8-12, New Delhi, pp. 53-58.
Harris, Jonathan H., "Sintered Aluminum Nitride Ceramics for High-Power Electronic Applications" Journal of the Minerals, Metals and Materials Society, vol. 50, No. 6, Jun. 1998, p. 56.
Horwitz, Chris M., "Electrostatic Chucks: Frequently Asked Questions" Electrogrip, 2006, 10 pgs, accessed at www.electrogrip.com.
Hossick-Schott, Joachim, "Prospects for the ultimate energy density of oxide-based capacitor anodes" Proceedings of CARTS Europe, Barcelona, Spain, 2007, 10 pgs.
Lee, San Youl, et al., "Wafer-level fabrication of GAN-based vertical light-emitting diodes using a multi-functional bonding material system" Semicond. Sci. Technol. 24, 2009, 4 pgs.
"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.
Mei, Zequn, et al., "Low-Temperature Solders" Hewlett-Packard Journal, Article 10, Aug. 1996, pp. 1-10.
Mercado, Lei, L., et al., "A Mechanical Approach to Overcome RF MEMS Switch Stiction Problem" 2003 Electronic Components and Technology Conference, pp. 377-384.
Miskys, Claudio R., et al., "Freestanding GaN-substrates and devices" phys. Stat. sol. © 0, No. 6, 2003, pp. 1627-1650.
"Principles of Electrostatic Chucks: 1—Techniques for High Performance Grip and Release" ElectroGrip, Principles1 rev3 May 2006, 2 pgs, accessed at www.electrogrip.com.
Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.
Widas, Robert, "Electrostatic Substrate Clamping for Next Generation Semiconductor Devices" Apr. 21, 1999, 4 pgs.

\* cited by examiner

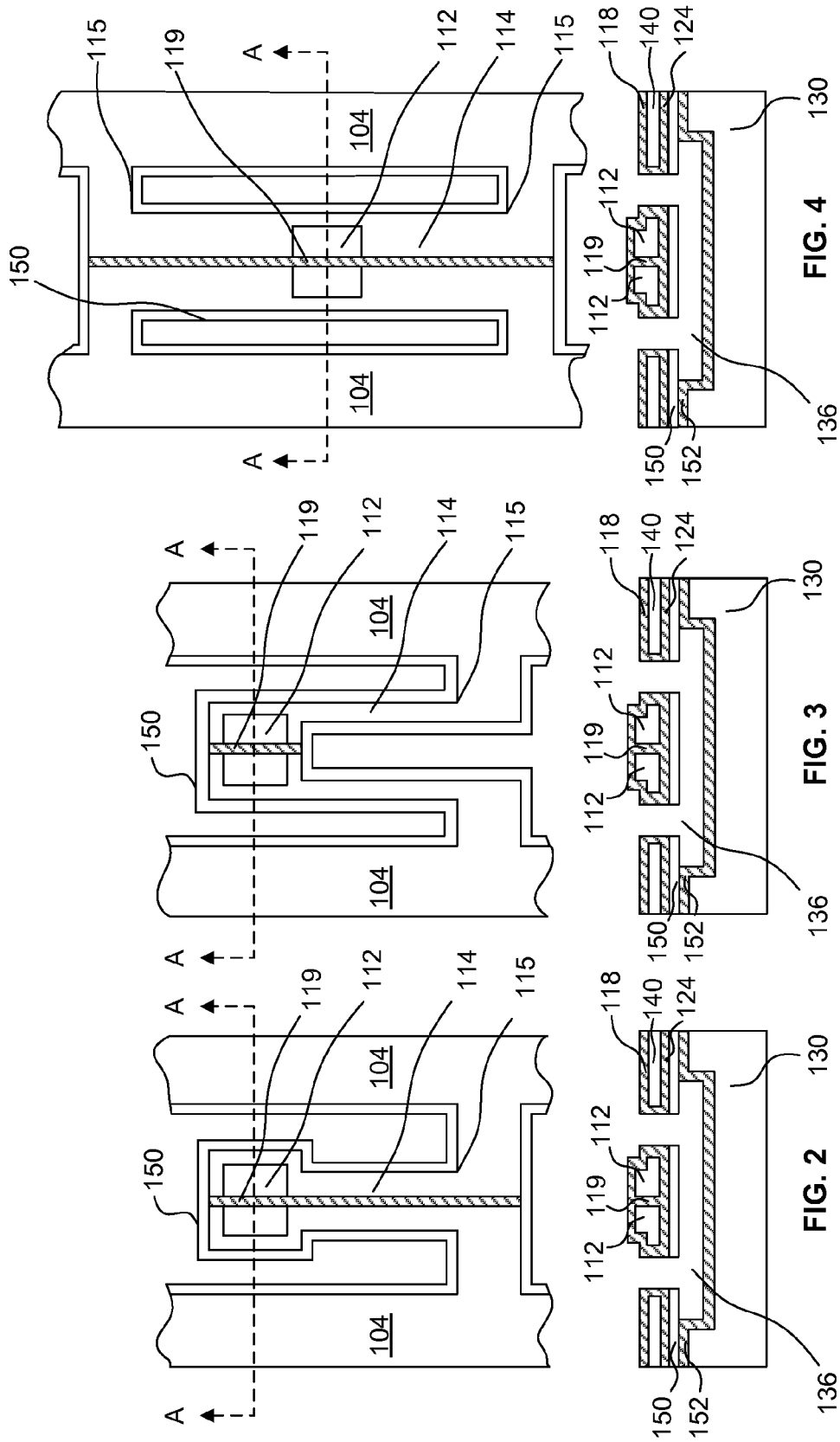

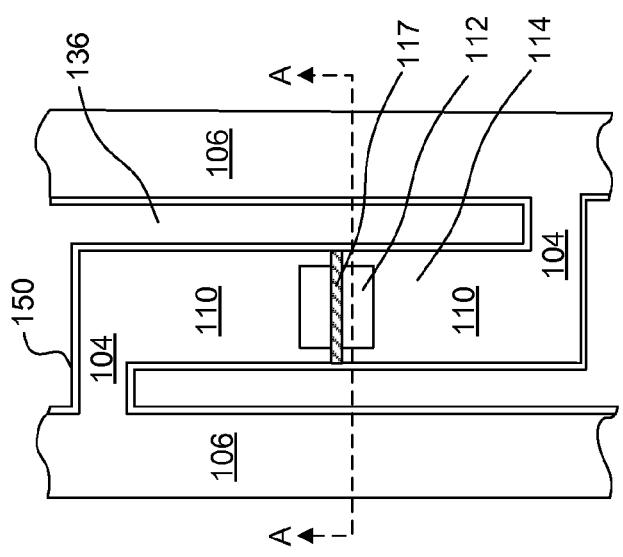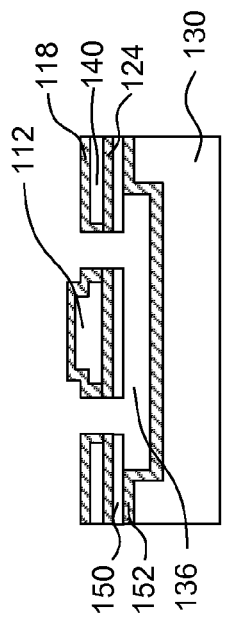
FIG. 8
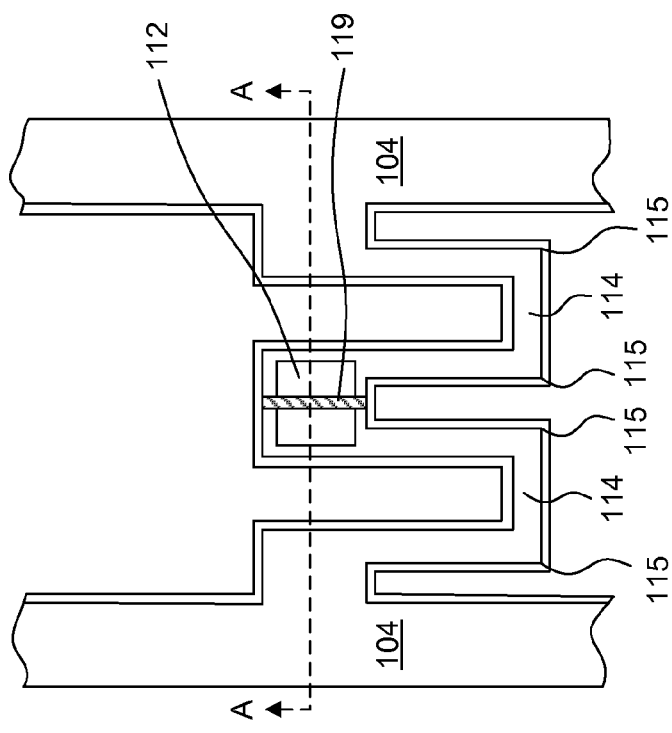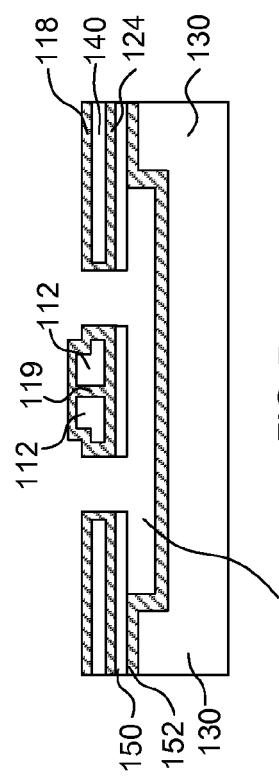
FIG. 7

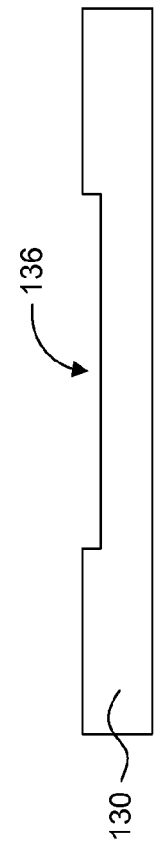
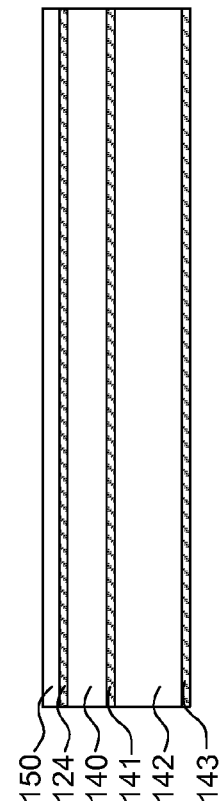
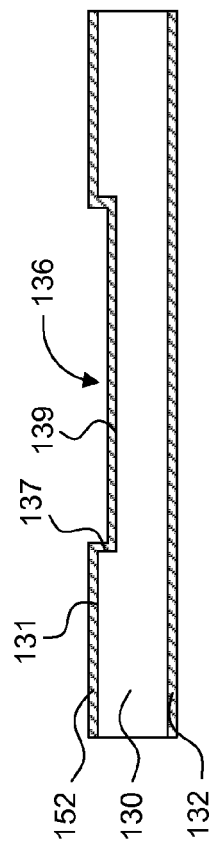
FIG. 10
FIG. 11
FIG. 12
FIG. 13

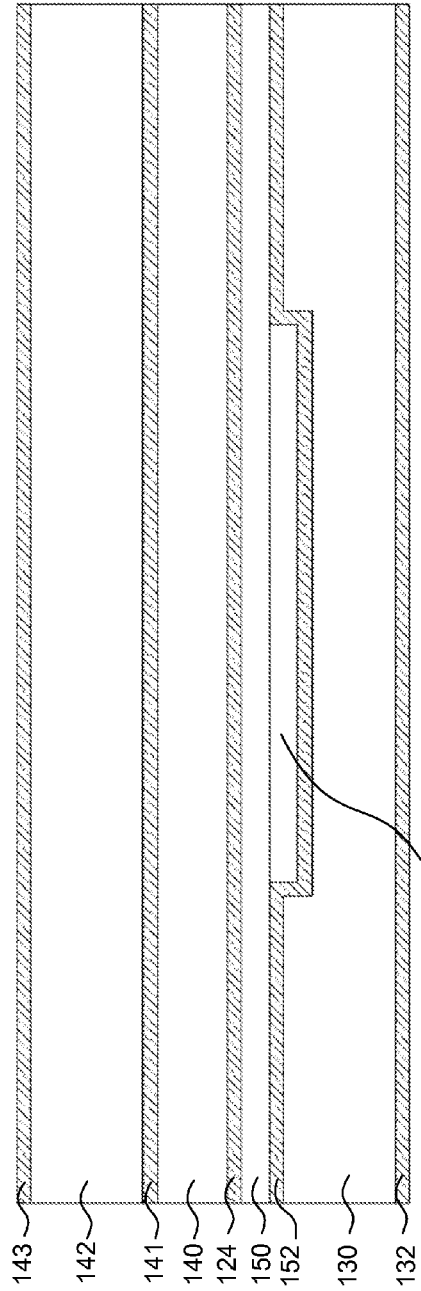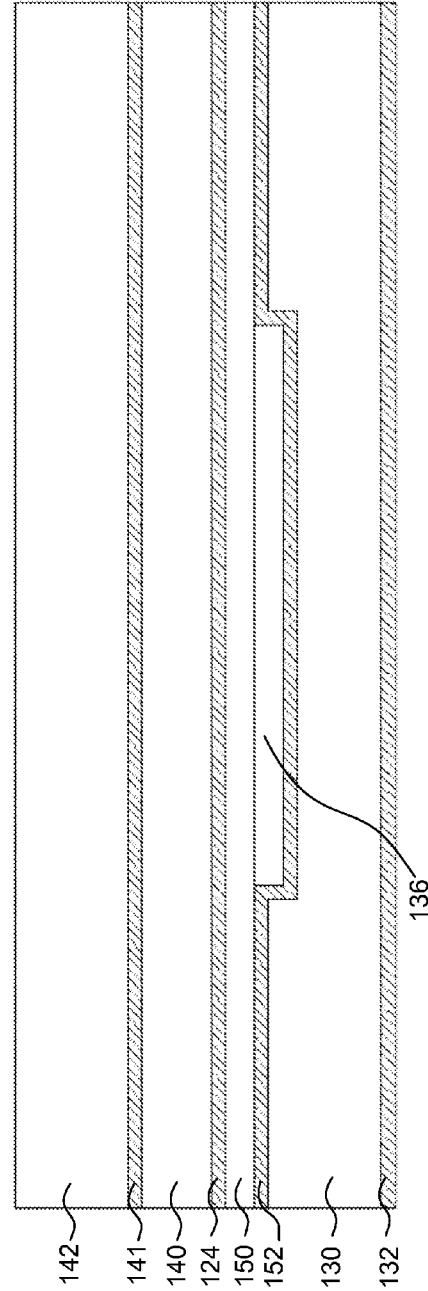

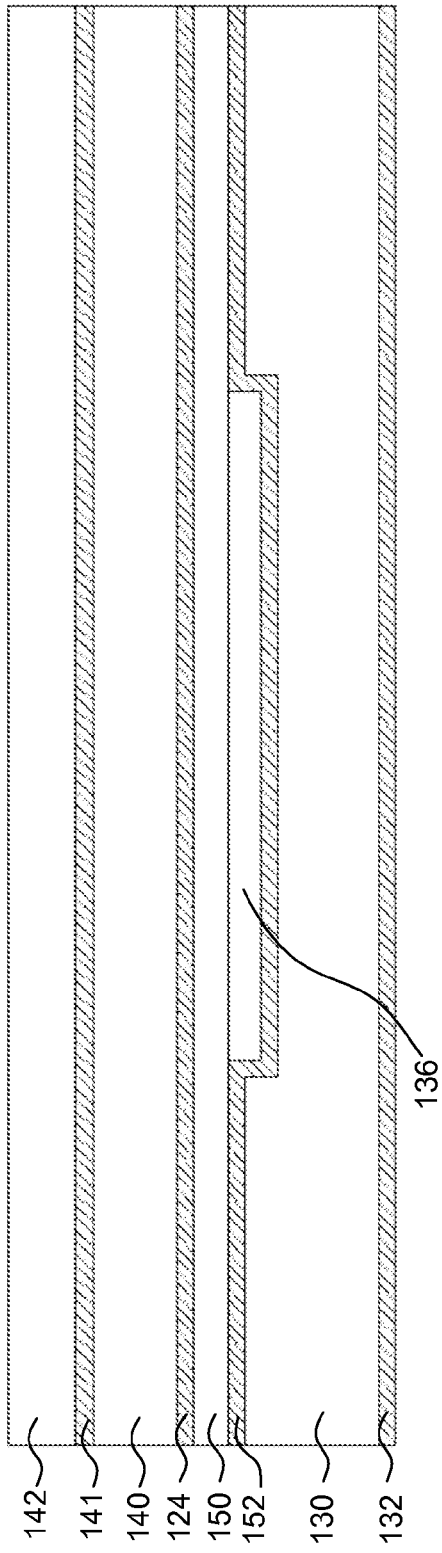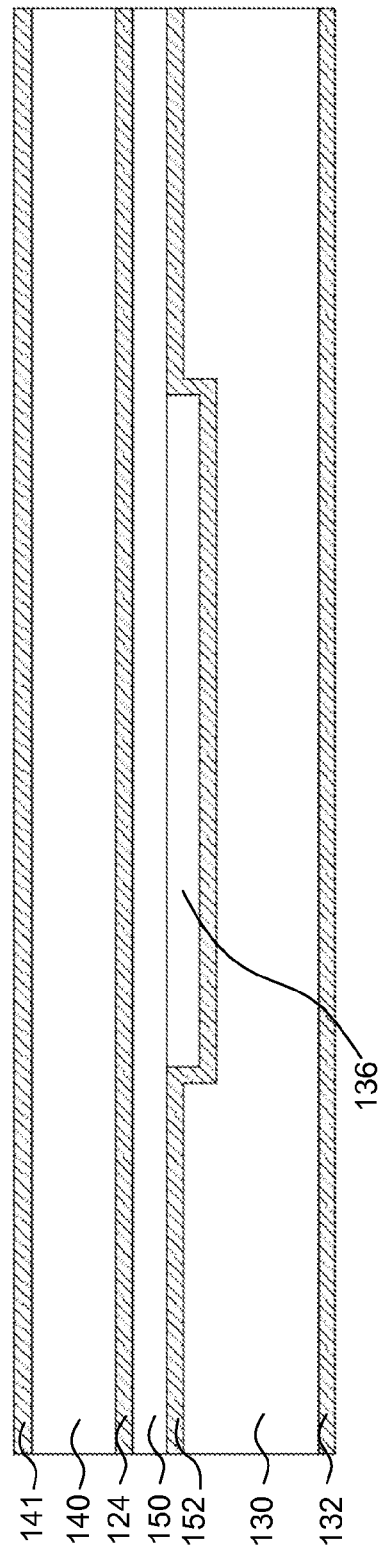

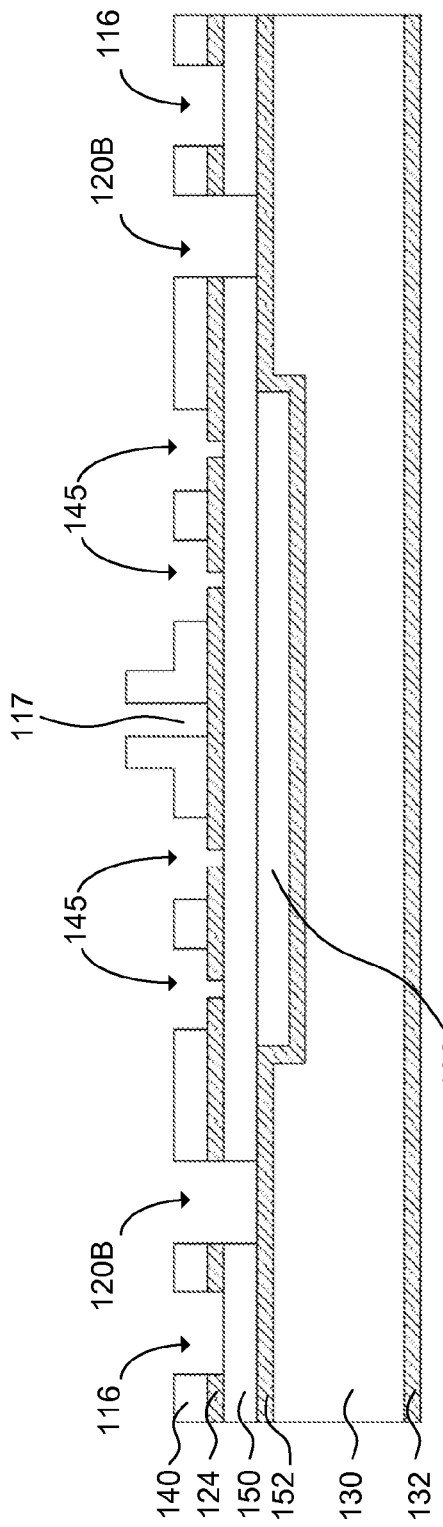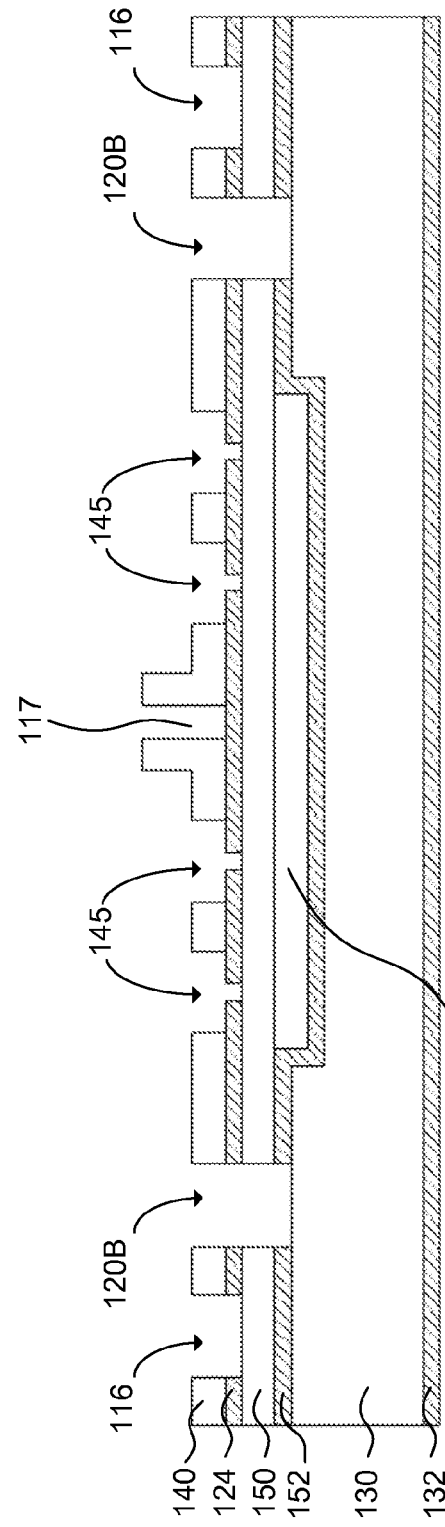

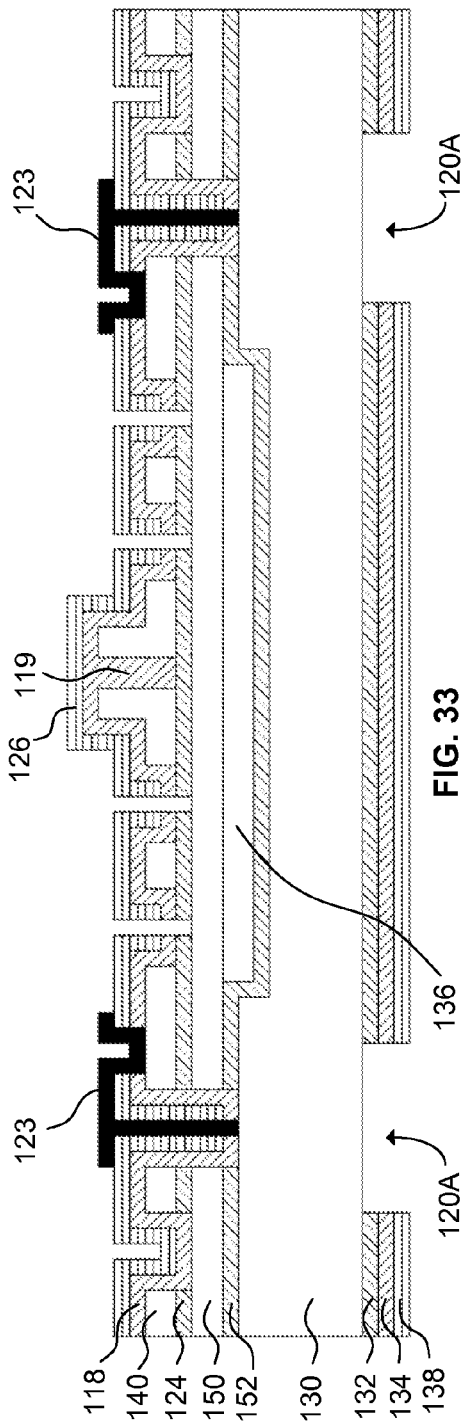
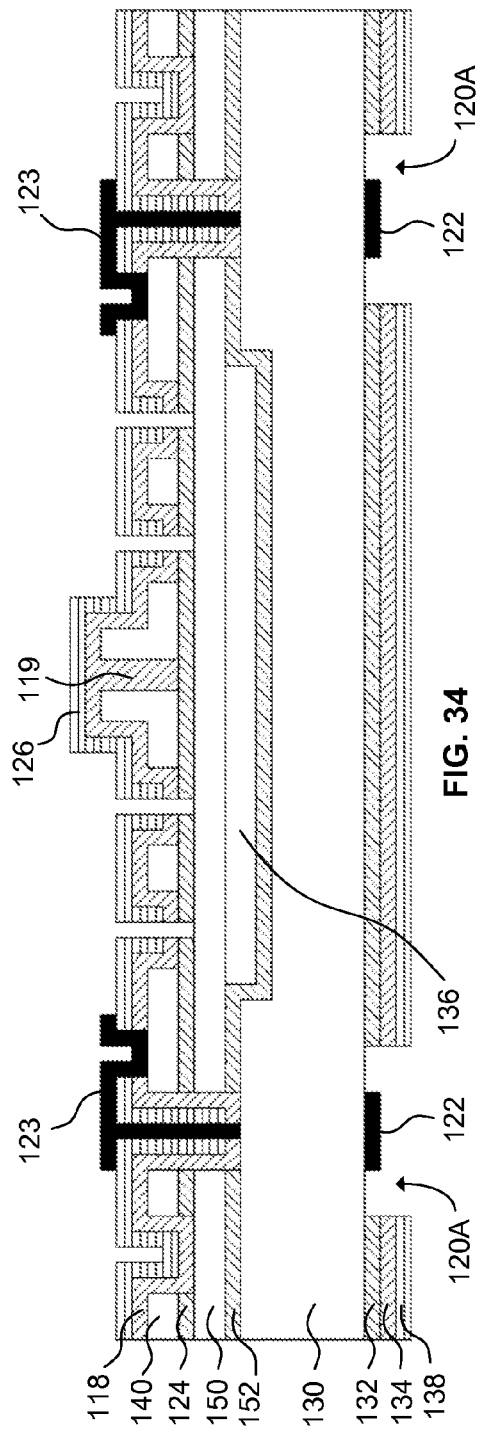

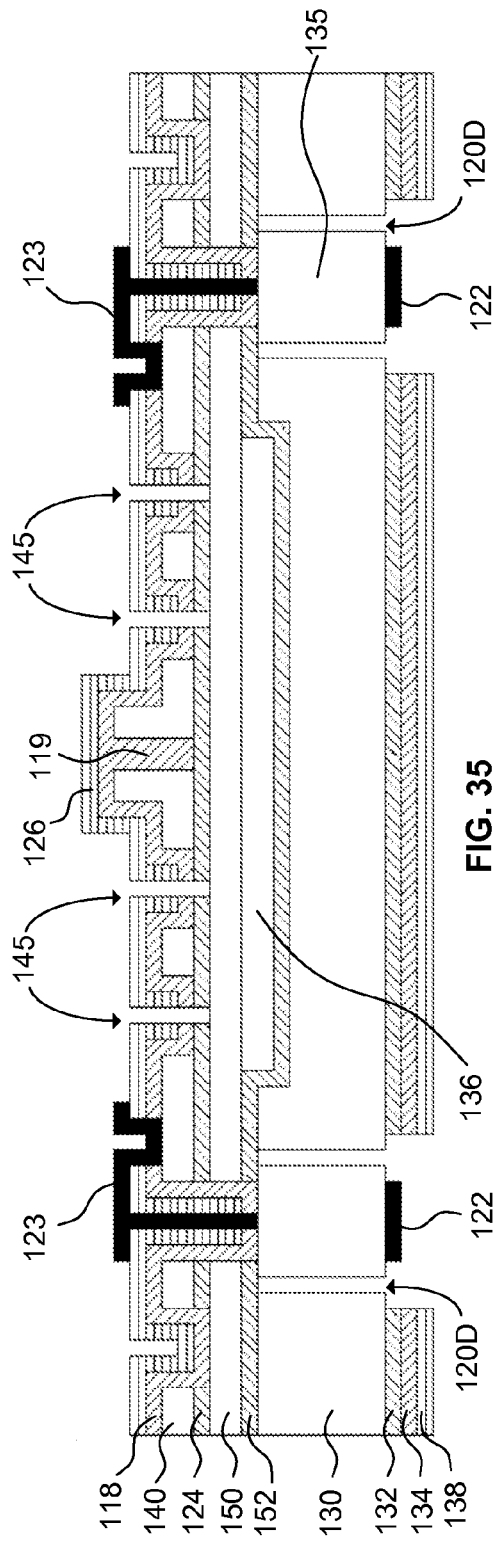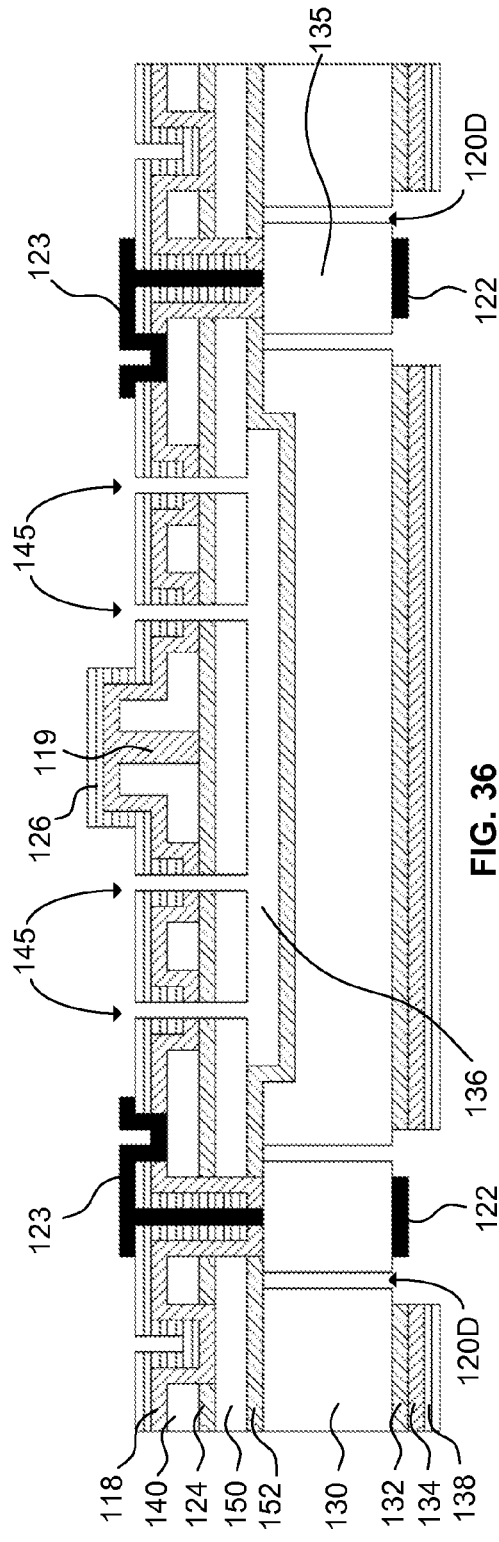

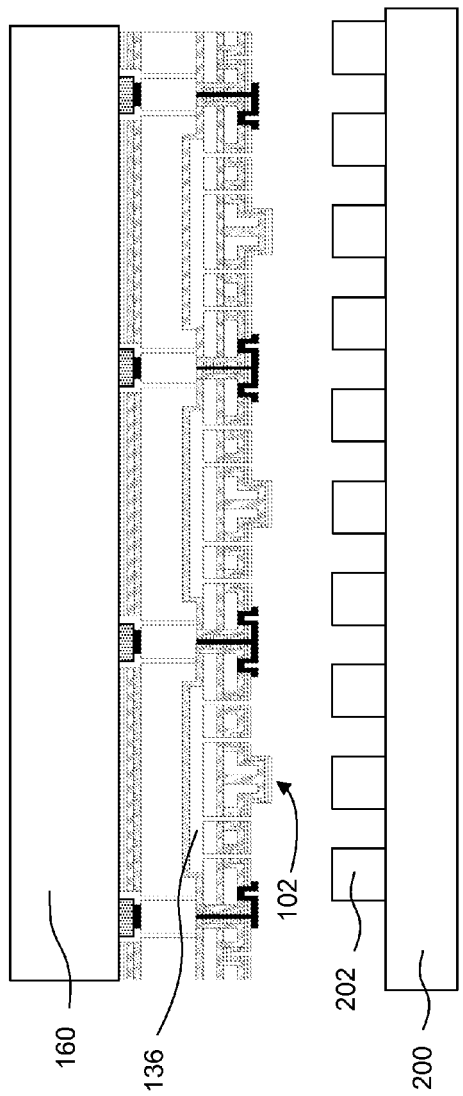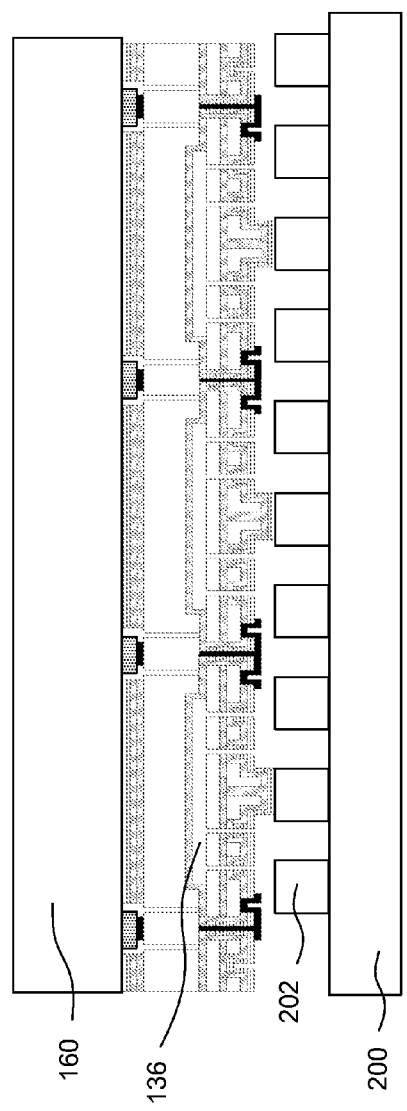

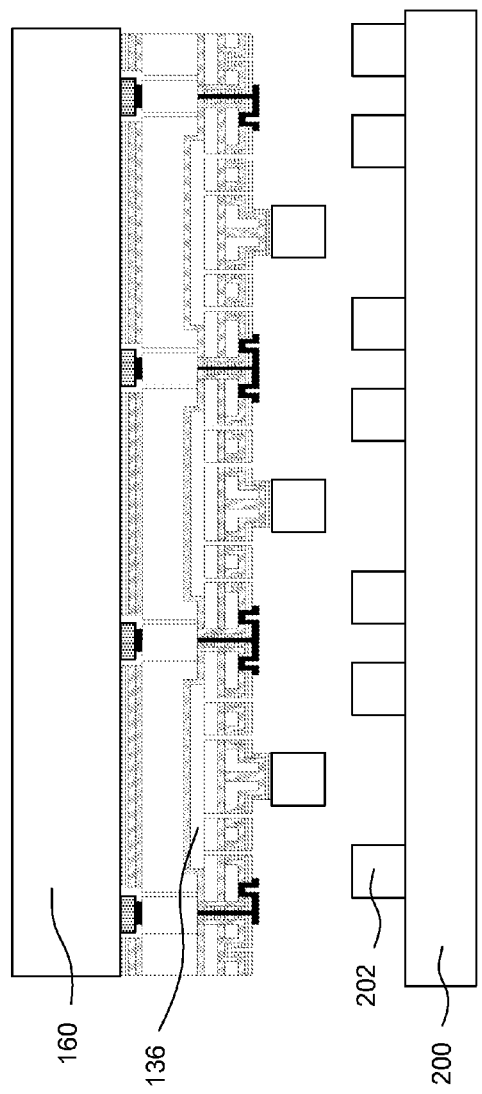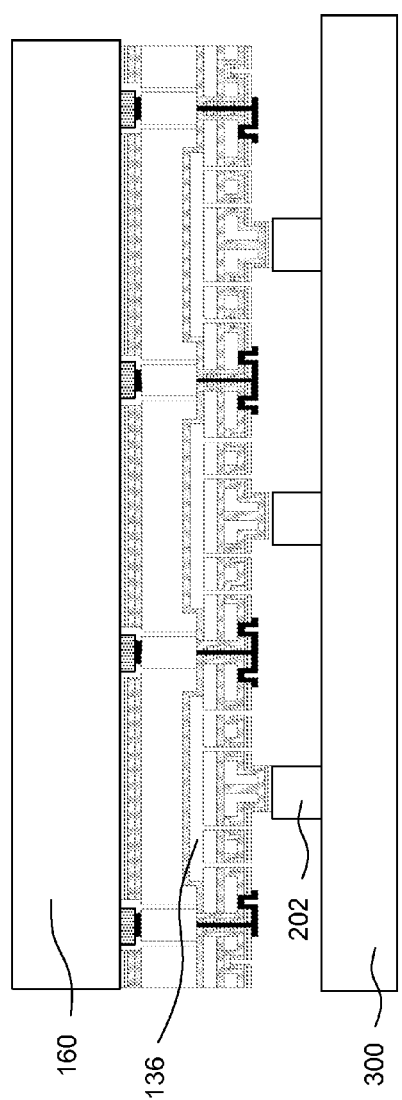

COMPLIANT ELECTROSTATIC TRANSFER HEAD WITH SPRING SUPPORT LAYER

BACKGROUND

1. Field

The present invention relates to micro devices. More particularly embodiments relate to a compliant electrostatic transfer head array and a method of transferring micro devices to a receiving substrate.

2. Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators. Traditional technologies for transferring of devices include transfer by wafer bonding from a transfer wafer to a receiving wafer. Such implementations include "direct printing" and "transfer printing" involving wafer bonding/de-bonding steps in which a transfer wafer is de-bonded from a device after bonding the device to the receiving wafer. In addition, the entire transfer wafer with the array of devices is involved in the transfer process.

Other technologies for transferring of devices include transfer printing with elastomeric stamps. In one such implementation an array of elastomeric stamps matching the pitch of devices on a source wafer are brought into intimate contact with the surface of the devices on the source wafer and bonded with van der Walls interaction. The array of devices can then be picked up from the source wafer, transferred to a receiving substrate, and released onto the receiving substrate.

In another implementation, the technology for transferring of devices is enabled by an array of electrostatic transfer heads as described in U.S. Pat. No. 8,415,767. As described, an array of electrostatic transfer heads may be formed from a silicon-on-insulator (SOI) substrate. Furthermore, the array of electrostatic transfer heads may be made compliant such that each silicon electrode is deflectable into a cavity between a base silicon substrate and the silicon electrode. In this manner, each compliant electrostatic transfer head can compensate for variations in height of the devices during the transfer process.

SUMMARY

A compliant electrostatic transfer head, method of forming a compliant electrostatic transfer head are described, and a method of transferring one or more micro devices to a receiving substrate are disclosed. For example, the receiving substrate may be, but is not limited to, a display substrate, a lighting substrate, a substrate with functional devices such as transistors or integrated circuits (ICs), or a substrate with metal redistribution lines. In an embodiment, a compliant electrostatic transfer head includes a cavity in a base substrate, a spring support layer on the base substrate, and a patterned device layer on the spring support layer. A first insulating layer may be formed on the spring support layer, wherein the first insulating layer electrically insulates the patterned device layer from the spring support layer. The spring support layer includes a spring support layer beam profile that extends over and is deflectable toward the cavity, and the patterned device layer includes an electrode beam profile that is supported by the spring support layer beam profile and extends over and is deflectable toward the cavity. In some embodiments, any or all of the base substrate, spring support layer, and patterned device layer are formed of silicon. In an embodiment, a second insulating layer is formed between the base substrate and the spring support layer, where the second insulating layer electrically insulates the spring support layer from the base substrate. For example, the second insulating may span along a top surface of the base substrate, sidewalls of the cavity, and a bottom surface of the cavity.

In an embodiment, the compliant electrostatic transfer head includes a bipolar electrode configuration. For example, the electrode beam profile of the patterned device layer includes a pair of electrodes, and the pair of electrodes includes a first electrode lead integrally formed with a first mesa structure protruding above the first electrode lead, and a second electrode lead integrally formed with a second mesa structure protruding above the second electrode lead. The patterned device layer may further include a first trace interconnect integrally formed with the first electrode, and a second trace interconnect integrally formed with the second electrode. In an embodiment, the electrode beam profile extends between the first and second trace interconnects. Likewise, the spring support layer beam profile may extend between the first and second trace interconnects. The spring support layer beam profile may be wider than the electrode beam profile. In an embodiment each of the first and second electrodes includes a double bend. For example, a double bend may be in the form of an S-shape configuration.

In an embodiment, a first via is formed in the base substrate and a first plug is formed within the first via, the first plug electrically coupled to the first trace interconnect and the first electrode lead. In an embodiment, a second via is formed in the base substrate and a second plug is formed within the second via, the second plug electrically coupled to the second trace interconnect and the second electrode lead.

The compliant electrostatic transfer heads in accordance with embodiments may be substantially smaller than conventional transfer heads. For example, a first top surface of the first mesa structure may have a maximum width and length of less than 50 microns in both x and y dimensions, respectively, and a second top surface of the second mesa structure may have a maximum width and length of less than 50 microns in both x and y dimensions, respectively. More specifically, the first top surface of the first mesa structure may have a maximum width of 10 µm or less and length 4.5 µm or less, and the second top surface of the second mesa structure may have a maximum width of 10 µm or less and length 4.5 µm or less. In an embodiment, the first and second mesa structures are separated by a trench characterized by a width of 1.0 µm or less. The trench may be filled with one or more dielectric materials.

In an embodiment, a method of forming a compliant electrostatic transfer head includes bonding a wafer stack including a spring support layer and device layer to a base substrate that includes a cavity formed in the base substrate. The patterned device layer is then patterned to include an electrode beam profile above the cavity, and the spring support layer is patterned to include a spring support layer beam profile underneath and supporting the electrode beam profile. Patterning the spring support layer may include etching a beam profile opening through the spring support layer to expose the cavity. The spring support layer may completely cover the cavity prior to patterning the spring support layer to include the spring support layer beam profile. Patterning the device layer may include forming a pair of electrodes over the cavity, with each electrode including an electrode lead and a mesa structure. Such a configuration is exemplary of a bipolar compliant electrostatic transfer head configuration.

Bonding the wafer stack to the base substrate includes bonding an insulating layer formed on a top surface of the base substrate to the spring support layer in an embodiment. For example, this bonding may be fusion bonding. In an embodiment, the insulating layer is formed on a top surface of the base substrate, sidewalls of the cavity, and a bottom surface of the cavity prior to bonding to the wafer stack.

BRIEF DESCRIPTION OF THE DRAWINGS

FIG. 2 is a plan view illustration and cross-sectional side view illustration taken along line A-A of a bipolar compliant electrostatic transfer head with cantilever beam and continuous joint supported by a spring support layer in accordance with an embodiment.

FIG. 3 is a plan view illustration and cross-sectional side view illustration taken along line A-A of a bipolar compliant electrostatic transfer head with cantilever beam and mesa joint supported by a spring support layer in accordance with an embodiment.

FIG. 4 is a plan view illustration and cross-sectional side view illustration taken along line A-A of a bipolar compliant electrostatic transfer head with double sided clamped beam and continuous joint supported by a spring support layer in accordance with an embodiment.

FIG. 7 is a plan view illustration and cross-sectional side view illustration taken along line A-A of a bipolar compliant electrostatic transfer head with a double sided clamped beam including a pair of silicon electrodes with double bends and a mesa joint in accordance with an embodiment.

FIG. 8 is a plan view illustration and cross-sectional side view illustration taken along line A-A of a bipolar compliant electrostatic transfer head with a double sided clamped supported beam and pair of silicon electrodes supported by a spring support layer in accordance with an embodiment.

FIGS. 10-12 are cross-sectional side view illustrations of a method of forming a base substrate with one or more cavities in an embodiment.

FIG. 13 is a cross-sectional side view illustration of a double SOI stacked wafer in accordance with an embodiment.

FIGS. 14-36 are cross-sectional side view illustration of a method of bonding a double SOI stacked wafer to a base substrate with one or more cavities and patterning the bonded structure to form a bipolar compliant electrostatic transfer head array supported by a spring support layer in accordance with an embodiment.

FIG. 38 is a cross-sectional side view illustration of an array of bipolar compliant electrostatic transfer heads positioned over an array of micro devices on a carrier substrate in accordance with an embodiment.

FIG. 39 is a cross-sectional side view illustration of an array of bipolar compliant electrostatic transfer heads in contact with an array of micro devices in accordance with an embodiment.

FIG. 40 is a cross-sectional side view illustration of an array of bipolar compliant electrostatic transfer heads picking up an array of micro devices in accordance with an embodiment.

FIG. 41 is a cross-sectional side view illustration of contacting a receiving substrate with an array of micro devices held by an array of bipolar compliant electrostatic transfer heads in accordance with an embodiment.

DETAILED DESCRIPTION

Figure 1A:
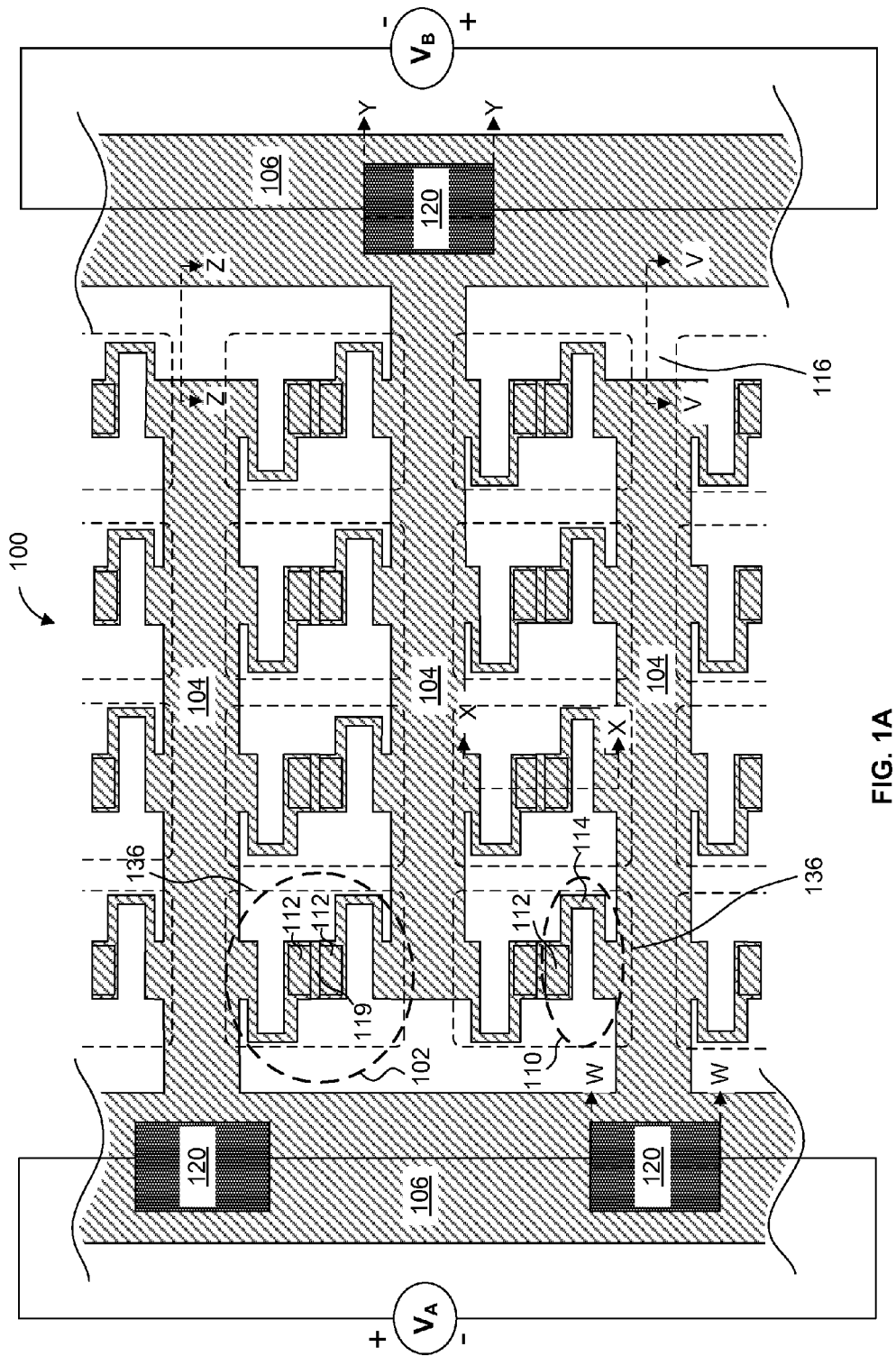
FIG. 1A is a plan view illustration of a micro pick up array including an array of bipolar compliant electrostatic transfer heads in accordance with an embodiment.

Embodiments describe a compliant electrostatic transfer head and micro pick up array including a spring support layer, and method of transferring a micro device and an array of micro devices to a receiving substrate. In an embodiment, a compliant electrostatic transfer head includes a cavity in a base substrate, a spring support layer on the base substrate, and a patterned device layer on the spring support layer. The spring support layer includes a spring support layer beam profile that extends over and is deflectable toward the cavity, and the patterned device layer includes an electrode beam profile that is supported by the spring support layer beam profile and extends over and is deflectable toward the cavity. In an embodiment the compliant electrostatic transfer head includes a bipolar electrode configuration. For example, the electrode beam profile of the patterned device layer may include a pair of electrodes, and the pair of electrodes includes a first electrode lead integrally formed with a first mesa structure protruding above the first electrode lead, and a second electrode lead integrally formed with a second mesa structure protruding above the second electrode lead. Embodiments are not limited to bipolar electrode configurations. For example, embodiments may be directed toward monopolar electrode configurations and multiple electrode configurations including more than two electrodes.

In accordance with some embodiments fabrication of a micro pick up array includes forming an array of cavities within a base substrate, bonding an SOI stack to the patterned base substrate, and then patterning an array of silicon electrodes above the array of cavities. In this manner, the dimensions of the cavities toward which the silicon electrodes deflect is precisely controlled at an initial fabrication stage, and an etch release of the beam profiles of the spring support layer can be performed at a terminal stage in the fabrication process, thereby preserving the integrity of the silicon electrodes.

Without being limited to a particular theory, embodiments describe electrostatic transfer heads and micro pick up arrays which operate in accordance with principles of electrostatic grippers, using the attraction of opposite charges to pick up micro devices. In accordance with embodiments, a pull-in voltage is applied to an electrostatic transfer head in order to generate a grip pressure on a micro device and pick up the micro device. For example, the electrostatic transfer head may include a bipolar electrode configuration. The compliant electrostatic transfer head and head arrays in accordance with embodiments may be used to transfer micro devices such as, but not limited to, diodes, LEDs, transistors, MEMS, silicon integrated circuits (ICs) for logic or memory, and gallium arsenide (GaAs) circuits for radio frequency (RF) communications from a carrier substrate to a receiving substrate such as, but is not limited to, a display substrate, a lighting substrate, a substrate with functional devices such as transistors or ICs, or a substrate with metal redistribution lines.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "one embodiment," "an embodiment" or the like means that a particular feature, structure, configuration, or characteristic described in connection with the embodiment is included in at least one embodiment. Thus, the appearances of the phrase "in one embodiment," "an embodiment" or the like in various places throughout this specification are not necessarily referring to the same embodiment. Furthermore, the particular features, structures, configurations, or characteristics may be combined in any suitable manner in one or more embodiments.

The terms "over", "to", "spanning", "between" and "on" as used herein may refer to a relative position of one layer with respect to other layers. One layer "over", "spanning" or "on" another layer or bonded "to" another layer may be directly in contact with the other layer or may have one or more intervening layers. One layer "between" layers may be directly in contact with the layers or may have one or more intervening layers.

In one aspect, embodiments of the invention describe a micro pick up array including an array of compliant electrostatic transfer heads, and method of operation in which the array of compliant electrostatic transfer heads enables improved contact with an array of micro devices as compared to an array of non-compliant transfer heads. In application, as a micro pick up array is lowered onto an array of micro devices, each compliant electrostatic transfer head is independently deflectable toward a base substrate, e.g. toward a cavity in the base substrate. In this manner, each compliant electrostatic transfer head can compensate for variations in height of the micro devices, impurities (e.g. particles) on the micro devices, or surface profile variations of the carrier substrate such as surface waviness. Such compensation can result in reduced compressive forces applied to certain micro devices, leading to protection of the physical integrity of the micro devices and transfer head array. Such compensation can also assist each compliant electrostatic transfer head to make contact with each micro device, and ensure that each intended micro device is picked up. Without the compliant nature of the compliant electrostatic transfer heads an irregular micro device height, wavy carrier substrate, or a particle on a top surface of a single micro device could prevent the remainder of the transfer heads from making contact with the remainder of the micro devices in the array. As a result, an air gap could be formed between those transfer heads and micro devices. With such an air gap, it is possible that the target applied voltage would not create a sufficient grip pressure to overcome the air gap, resulting in an incomplete pick-up process.

In another aspect, embodiments describe a micro pick up array including a spring support layer beneath a device layer including the silicon electrodes. The spring support layer beam profiles of the spring support layer can function to stabilize the electrode beam profiles of the silicon electrodes, particularly in a bipolar electrode design in which a dielectric layer supports the two silicon electrode mesa structures. In such a configuration, the spring support layer may relieve bending stress that may result due to loading the two silicon electrode mesa structures, particularly when the silicon electrodes deflect. In addition to adding physical integrity, the inclusion of a spring support layer can function to decouple the mechanical requirements of the device layer and allows an additional degree of freedom for tuning the mechanical spring function of a compliant electrostatic transfer head such that a particular mechanical spring function can be achieved irrespective of the electrode design or pattern in the device layer.

In another aspect, embodiments describe a manner of forming an array of compliant electrostatic transfer heads from commercially available silicon and silicon-on-insulator (SOI) substrates. In an embodiment, one or more cavities are formed in a base substrate prior to bonding an SOI substrate stack to the patterned base substrate including the one or more cavities. In this manner, the cavities with precisely controlled depths and dimensions can be fabricated prior to patterning the spring support layer and device layer. This allows for a spring release etch operation of the spring support layer beam profiles to be performed at or near a terminal end of the processing sequence, and preserves the structural and electrical integrity of the compliant electrostatic transfer heads. Additionally, this may ensure a uniform profile of the cavity, or arrays of cavities beneath the arrays of compliant electrostatic transfer heads.

The terms "micro" device or "micro" LED structure as used herein may refer to the descriptive size of certain devices or structures in accordance with embodiments. As used herein, the terms "micro" devices or structures are meant to refer to the scale of 1 to 300 µm, for example, each micro device or electrostatic transfer head including a maximum length or width of a contact surface or mesa structure of 1 to 300 µm. For example, each electrostatic transfer head may include a pair of silicon electrodes, with each silicon electrode including a mesa structure with a maximum width or length of 1 to 300 µm, 1 to 100 µm, or more specifically 1 to 10 µm. In an exemplary embodiment, an electrostatic transfer head has a contact surface of approximately 10 µm by 10 µm. In an embodiment, a bipolar electrostatic transfer head includes a pair of mesa structure of approximately 4.5 µm (width) by 10 µm (length) separated by a 1 µm gap. In another exemplary embodiment, a bipolar electrostatic transfer head having a contact surface of approximately 5 μm by 5 μm includes a pair of mesa structure of approximately 2.25 μm (width) by 5 μm (length) separated by a 0.5 μm gap. However, it is to be appreciated that embodiments are not necessarily so limited, and that certain aspects of the embodiments may be applicable to larger, and possibly smaller size scales.

In some exemplary embodiments, arrays of micro devices which are poised for pick up are described as having a size of 10 μm (in x and/or y dimensions), or size of 5 μm (in x and/or y dimensions). However, it is to be appreciated that embodiments are not necessarily so limited, and that certain aspects of the embodiments may be applicable to larger, and possibly smaller size scales as described above with regard to the electrostatic transfer heads. A transfer tool including an array of compliant electrostatic transfer heads matching an integer multiple of a pitch of the corresponding array of micro devices on a carrier substrate can be used to pick up and transfer the array of micro devices to a receiving substrate. In this manner, it is possible to integrate and assemble micro devices into heterogeneously integrated systems, including substrates of any size ranging from micro displays to large area displays, and at high transfer rates. For example, a 1 cm by 1 cm array of compliant electrostatic transfer heads can pick up and transfer more than 100,000 micro devices, with larger arrays of compliant electrostatic transfer heads being capable of transferring more micro devices.

Referring now to FIG. 1A, a plan view illustration is provided for a micro pick up array including an array of bipolar compliant electrostatic transfer heads, and includes views at different depths. In the particular embodiment illustrated, the shaded area illustrates an arrangement of silicon electrodes and silicon interconnects as viewed from the top surface of the bipolar compliant electrostatic transfer head array. The darker shading illustrates a top side via connection as viewed from the top side surface of the bipolar compliant electrostatic transfer head array. Exemplary locations of cavities 136 are illustrated as dotted lines underneath the silicon electrodes. In this manner, the plan view illustration provides detail regarding structures at various depths from a top side of the SOI wafer stack. It is to be appreciated that while FIG. 1A illustrates a bipolar electrode configuration, that embodiments are not limited to bipolar electrode configurations, and embodiments are also applicable to other electrode configurations including monopolar electrode configurations or electrode configurations including more than two electrodes.

As illustrated, the micro pick up array 100 includes an array of compliant electrostatic transfer heads 102 connected to an arrangement of silicon trace interconnects 104, and bus interconnects 106. As illustrated, bus interconnects 106 may be formed around a periphery or outside a working area of the micro pick up array including the array of compliant electrostatic transfer heads 102. In an embodiment, each compliant electrostatic transfer head 102 includes a pair of silicon electrodes 110, with each silicon electrode 110 including a mesa structure 112 and an electrode lead 114 connected to a silicon interconnect 104. As illustrated, each compliant electrostatic transfer head 102 is in the form of a double sided clamped beam profile clamped at opposite sides to silicon trace interconnects 104. As illustrated, a silicon electrode double sided clamped beam may include a pair of silicon electrode leads 114 each with a double bend 115, and pair mesa structures 112 separated by a mesa dielectric joint 119 that extends in a transverse width of the double sided clamped beam parallel to the pair of silicon interconnects 104. In such an embodiment, the dielectric joint 119 electrically insulates the pair of silicon electrodes in the bipolar electrode configuration along a transverse width of the double sided clamped beam between the pair of mesa structures 112. In the particular embodiment illustrated, the beam is in an S-shape configuration, though a variety of other configurations are contemplated. In the embodiment illustrated, the array of mesa structure 112 pairs in the micro pick up array 100 are arranged with approximately the same pitch as the micro devices to be picked up, and placed, for example, corresponding to a pixel pitch on a display substrate for exemplary micro LED devices.

In an embodiment, a plurality of vias 120 are formed through the micro pick up array SOI stack to provide a back-side electrical contact to interconnects 106 in order to electrically connect the silicon electrodes 110 with working circuitry of a transfer head assembly. In the embodiment illustrated in FIG. 1A, the interconnect 106 on the left side of the illustration may be connected to a first voltage source $V_A$, and the interconnect 106 on the right side of the illustration may be connected to a second voltage source $V_B$. Where each compliant electrostatic transfer head 102 is operable as a bipolar electrostatic transfer head, voltage sources $V_A$ and $V_B$ may simultaneously apply opposite voltages so that each of the silicon electrodes 110 in a respective compliant electrostatic transfer head 102 has an opposite voltage.

Figure 1B:
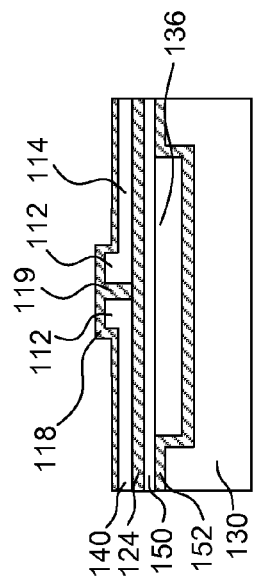
FIG. 1B is a plan view illustration of a bipolar compliant electrostatic transfer head with a double sided clamped beam including a pair of silicon electrodes with double bends and a mesa joint supported by a spring support layer in accordance with an embodiment.

FIG. 1B is a close-up plan view illustration of a single bipolar compliant electrostatic transfer head 102 of FIG. 1A. As illustrated, the double sided clamped beam includes a pair of silicon electrode leads 114 with double bends 115 and a mesa joint 119 between mesa structures 112, all supported by a spring support layer 150. The silicon electrodes form an electrode beam profile, and the spring support layer 150 forms a spring support layer beam profile underneath and supporting the electrode beam profile, where the spring support layer beam profile is wider than the supported electrode beam profile. A cavity 136 is formed within the base substrate 136 and the electrode beam profile and spring support layer beam profile are deflectable toward the cavity 136. In an embodiment, a separate cavity 136 is formed underneath each compliant electrostatic transfer head 102. In an embodiment, a single cavity 136 spans underneath multiple compliant electrostatic transfer heads 102.

Figure 1C:
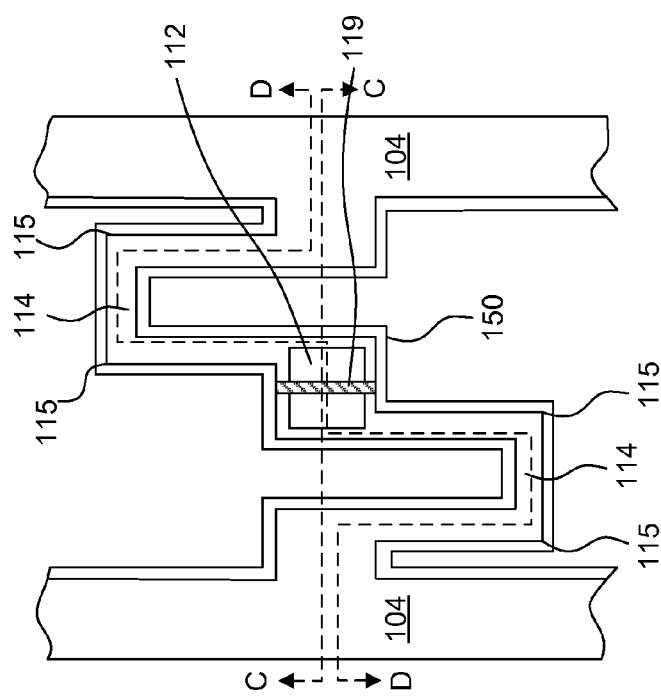
FIG. 1C is a cross-sectional side view illustration taken along transverse line C-C of the bipolar compliant electrostatic transfer head illustrated in FIG. 1B in accordance with an embodiment.
Figure 1D:
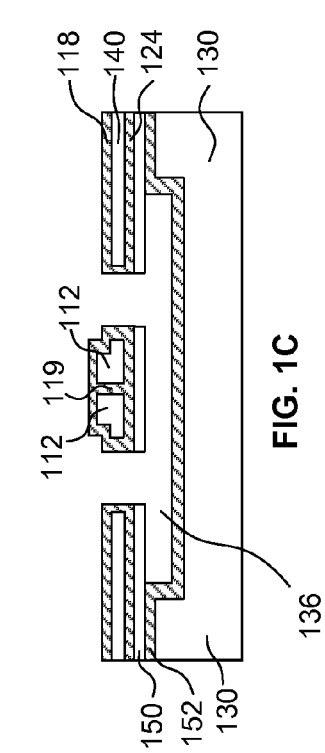
FIG. 1D is a cross-sectional side view illustration taken along longitudinal line D-D of the bipolar compliant electrostatic transfer head illustrated in FIG. 1B in accordance with an embodiment.

FIG. 1C is a cross-sectional side view illustration taken along transverse line C-C of the bipolar compliant electrostatic transfer head illustrated in FIG. 1B in accordance with an embodiment. In the embodiment illustrated in FIG. 1C, each silicon electrode 110 in a bipolar electrode configuration extends from a separate silicon interconnect 104. FIG. 1D is a cross-sectional side view illustration taken along longitudinal line D-D of the bipolar compliant electrostatic transfer head illustrated in FIG. 1B in accordance with an embodiment. As illustrated in FIGS. 1C-1D, both the silicon electrode mesa structures 112 and leads 114 extend over and are deflectable toward a cavity 136 between the base substrate 130 and the silicon electrode 110. In an embodiment, a separate cavity 136 is formed underneath each bipolar silicon electrode 110 in the micro pick up array and between two separate silicon interconnects 104. In an embodiment, a single cavity 136 is formed underneath an array of bipolar silicon electrodes 110 and between two separate silicon interconnects 104. Referring again to FIG. 1A, a single or multiple separate cavities 136 can be formed between arrays of silicon interconnects 104. In an embodiment, cavities 136 are the same cavity. Trenches 116 may also be formed in the patterned silicon layer defining the silicon electrodes 110 and silicon interconnects 104, 106 as described in more detail in the following description.

FIGS. 2-8 illustrate various modifications of bipolar compliant electrostatic transfer heads spanning between silicon interconnects 104 in accordance with embodiments. While FIGS. 2-8 are illustrated separately from the detailed processing sequences illustrated in FIGS. 10-36, it is to be appreciated that many of the various modifications described with respect to FIGS. 2-8 can be implemented into the processing sequences. Similar to FIG. 1A, for clarity purposes, only a single bipolar compliant electrostatic transfer head 102 is illustrated in FIGS. 2-8 as spanning between two silicon trance interconnects 104, though an array of bipolar electrostatic transfer heads may span between the silicon interconnects 104 in accordance with embodiments. Also, similar to the single bipolar compliant electrostatic transfer head described with regard to FIGS. 1B-1D, FIGS. 2-8 each illustrate a pair of silicon electrodes that form an electrode beam profile and spring support layer beam profile that is wider than and supports the electrode beam profile.

FIG. 2 is a plan view illustration and cross-sectional side view illustration taken along line A-A of a bipolar compliant electrostatic transfer head with cantilever beam and continuous joint in accordance with an embodiment. As illustrated, a silicon electrode cantilever beam may include a pair of silicon electrode leads 114 extending from two silicon interconnects 104, and pair mesa structures 112 separated by a continuous dielectric joint 119 which extends in a longitudinal length of the cantilever beam parallel to the pair of silicon interconnects 104, all supported by a spring support layer 150. In such an embodiment, the dielectric joint 119 electrically insulates the pair of silicon electrodes in the bipolar electrode configuration along a longitudinal length of the cantilever beam along both the pair silicon electrode leads 114 and pair of mesa structures 112. As illustrated, the silicon electrode leads 114 may include a bend 115 (illustrated as a 90 degree bend).

FIG. 3 is a plan view illustration and cross-sectional side view illustration taken along line A-A of a bipolar compliant electrostatic transfer head with cantilever beam and mesa joint in accordance with an embodiment. As illustrated, a silicon electrode cantilever beam may include a pair of silicon electrode leads 114 extending from two silicon interconnects 104, and pair mesa structures 112 separated by a mesa dielectric joint 119 which extends in a longitudinal length of the cantilever beam parallel to the pair of silicon interconnects 104, all supported by a spring support layer 150. In such an embodiment, the dielectric joint 119 electrically insulates the pair of silicon electrodes in the bipolar electrode configuration along a longitudinal length of the cantilever beam along the pair of mesa structures 112. As illustrated, the pair of silicon electrode leads 114 are physically separated by patterning and may include a bend 115 (illustrated as a 90 degree bend).

FIG. 4 is a plan view illustration and cross-sectional side view illustration taken along line A-A of a bipolar compliant electrostatic transfer head with double sided clamped beam and continuous joint in accordance with an embodiment. As illustrated, a silicon electrode double sided clamped beam may include a pair of bent silicon electrode leads 114 extending from two silicon interconnects 104, and pair mesa structures 112 separated by a continuous dielectric joint 119 which extends in a longitudinal length of the cantilever beam parallel to the pair of silicon interconnects 104, all supported by a spring support layer 150. In such an embodiment, the dielectric joint 119 electrically insulates the pair of silicon electrodes in the bipolar electrode configuration along a longitudinal length of the double sided clamped beam along both the pair silicon electrode leads 114 and pair of mesa structures 112. As illustrated, the silicon electrode leads 114 may each include bends 115 (illustrated as 90 degree bends) at proximal and distal locations where the electrode leads extend from the silicon interconnects 104.

Figure 5:
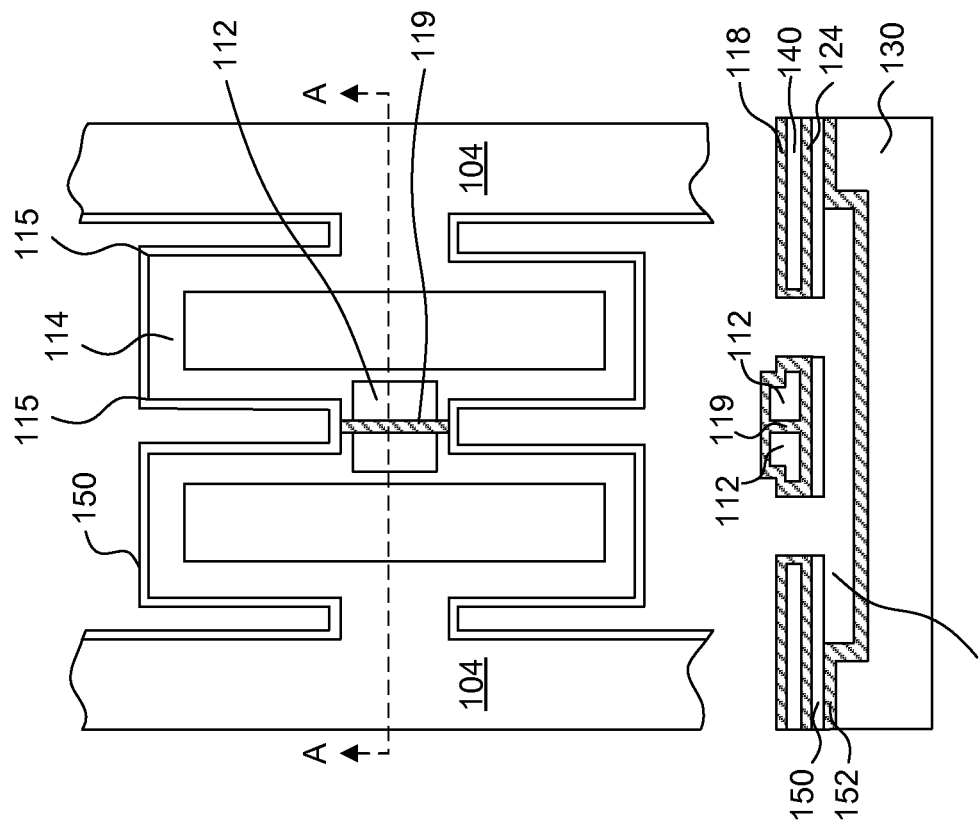
FIG. 5 is a plan view illustration and cross-sectional side view illustration taken along line A-A of a bipolar compliant electrostatic transfer head with a double sided clamped beam including a pair of silicon electrodes with double bends and a mesa joint supported by a spring support layer in accordance with an embodiment.

FIG. 5 is a plan view illustration and cross-sectional side view illustration taken along line A-A of a bipolar compliant electrostatic transfer head with a double sided clamped beam including a pair of silicon electrodes with double bends and a mesa joint in accordance with an embodiment. As illustrated, a silicon electrode double sided clamped beam may include a pair of silicon electrode leads 114 extending from two silicon interconnects 104, each lead 114 with a double bend 115, and pair mesa structures 112 separated by a mesa dielectric joint 119 which extends in a transverse width of the double sided clamped beam parallel to the pair of silicon interconnects 104, all supported by a spring support layer 150. In such an embodiment, the dielectric joint 119 electrically insulates the pair of silicon electrodes in the bipolar electrode configuration along a transverse width of the cantilever beam between the pair of mesa structures 112, and the pair of silicon electrode leads 114 are physically separated by patterning. In the embodiment illustrated, each electrode lead 114 is split, so that the beam configuration assumes an 8-shape configuration with the silicon electrode leads 114.

Figure 6:
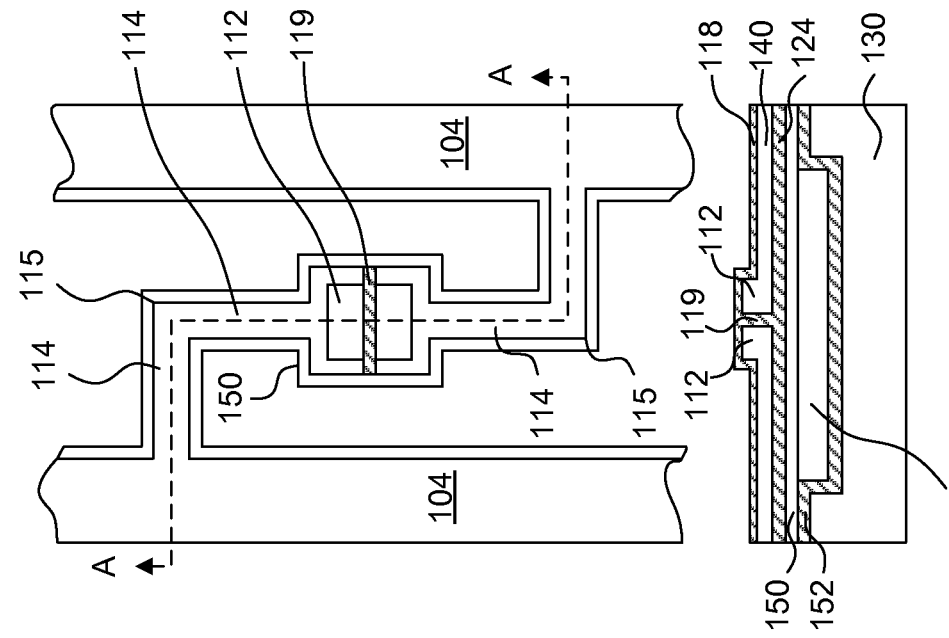
FIG. 6 is a plan view illustration and cross-sectional side view illustration taken along line A-A of a bipolar compliant electrostatic transfer head with a double sided clamped beam including a pair of silicon electrodes with single bends and a mesa joint supported by a spring support layer in accordance with an embodiment.

FIG. 6 is a plan view illustration and cross-sectional side view illustration taken along line A-A of a bipolar compliant electrostatic transfer head with a double sided clamped beam including a pair of silicon electrodes with single bends and a mesa joint in accordance with an embodiment. As illustrated, a silicon electrode double sided clamped beam may include a pair of silicon electrode leads 114 extending from two silicon interconnects 104, each lead 114 with a single bend 115, and pair mesa structures 112 separated by a mesa dielectric joint 119 extends in a transverse width of the double sided clamped beam perpendicular to the pair of silicon interconnects 104, all supported by a spring support layer 150. In such an embodiment, the dielectric joint 119 electrically insulates the pair of silicon electrodes in the bipolar electrode configuration along a transverse width of the double sided clamped beam between the pair of mesa structures 112, and the pair of silicon electrode leads 114 are physically separated by patterning.

FIG. 7 is plan view illustration and cross-sectional side view illustration taken along line A-A of a bipolar compliant electrostatic transfer head with a double sided clamped beam including a pair of silicon electrodes with double bends and a mesa joint in accordance with an embodiment. As illustrated, a silicon electrode double sided clamped beam may include a pair of silicon electrode leads 114 each with a double bend 115, and pair mesa structures 112 separated by a mesa dielectric joint 119 which extends in a transverse width of the double sided clamped beam parallel to the pair of silicon interconnects 104, all supported by a spring support layer 150. In such an embodiment, the dielectric joint 119 electrically insulates the pair of silicon electrodes in the bipolar electrode configuration along a transverse width of the double sided clamped beam between the pair of mesa structures 112. In the particular embodiment illustrated in FIG. 7, the beam is in a W-shape configuration.

FIG. 8 is plan view illustration and cross-sectional side view illustration taken along line A-A of a bipolar compliant electrostatic transfer head with a double sided clamped beam including a pair of silicon electrodes and a mesa joint in accordance with an embodiment. As illustrated, a silicon electrode double sided clamped beam may include a pair of silicon electrode leads 114 and a pair mesa structures 112 separated by a mesa dielectric joint 119 which extends in a transverse width of the double sided clamped beam parallel to the pair of silicon interconnects 104, all supported by a spring support layer 150. In such an embodiment, the dielectric joint 119 electrically insulates the pair of silicon electrodes in the bipolar electrode configuration along a transverse width of the double sided clamped beam between the pair of mesa structures 112.

Figure 9:
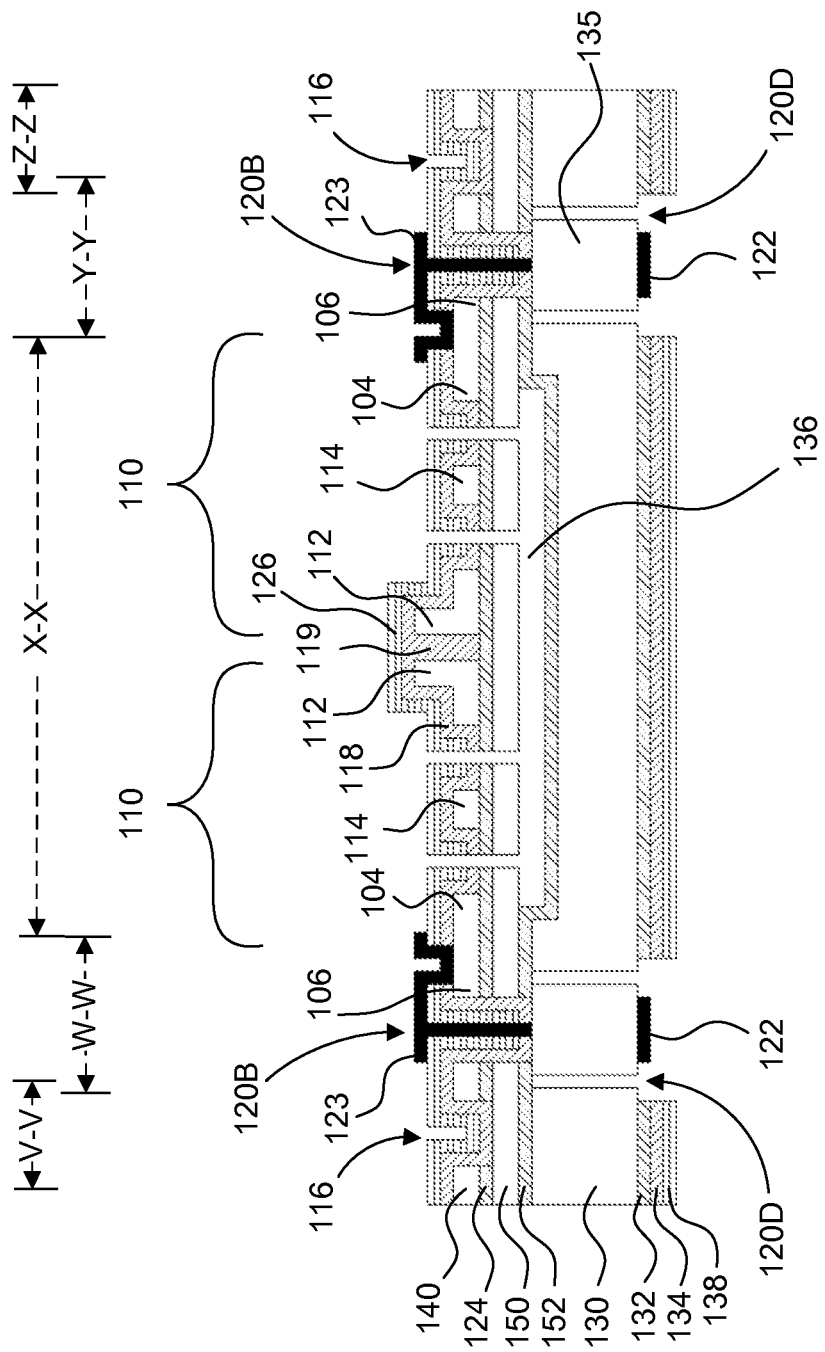
FIG. 9 is a combination cross-sectional side view illustration taken along lines V-V, W-W, X-X, Y-Y, and Z-Z from FIG. 1A in accordance with an embodiment.

Referring now to FIG. 9 a combination cross-sectional side view illustration is provided taken along lines V-V, W-W, X-X, Y-Y, and Z-Z from FIG. 1A in accordance with an embodiment. The combination view is not a representation of the precise relative locations for all of the different features illustrated, rather the combination view combines specific features at different locations previously identified in FIG. 1A in order to more easily represent the particular variations in processing sequences. For example, while the combination cross-sectional side view illustration shows one via 120 corresponding to one silicon electrode 110, it is clear from FIG. 1A that one via 120 may be electrically connected with a plurality of silicon electrodes 110 along one or more interconnects 104. As illustrated, lines W-W and Y-Y are along vias 120. As illustrated, lines V-V and Z-Z are along one or more trenches 116 defining the silicon electrodes 110 and silicon interconnects 104, 106. As illustrated, line X-X is across a bipolar compliant electrostatic transfer head including a pair of silicon electrodes 110. Referring again to FIG. 1A, one or more cavities 136 may be formed around and beneath all silicon electrodes 110, and between interconnects 104, 106.

A silicon electrode 110 includes a mesa structure 112 and an electrode lead 114, where the mesa structure 112 is an elevated portion of the silicon electrode 110. In an embodiment, the mesa structures 112 may be separated by a trench with a width of 1 μm or less. A first dielectric layer 118 may cover a top and side surfaces of the pair of silicon electrodes 110 and interconnects 104, 106. The first dielectric layer 118 may also cover a side surface of the mesa structures 112 within the trench laterally between the pair of mesa structure 112 for the pair of silicon electrodes 110 in a bipolar compliant electrostatic transfer head 102. As illustrated, the first dielectric layer 118 may form an dielectric joint 119 that fills the trench laterally between the pair of mesa structures 112. Since the dielectric joint 119 connects the silicon electrodes 110, the bipolar electrode assembly illustrated in FIG. 9A is characterized as a supported beam structure spanning between silicon interconnects, in which the joined supported beam structure is deflectable toward cavity 136.

The bipolar compliant electrostatic transfer head includes a base substrate 130, a spring layer 150 on the base substrate 130, and a patterned device layer 140 on the spring support layer 150. The patterned device layer includes the pair of silicon electrodes 110 that is deflectable toward the base substrate 130. For example, the pair of silicon electrodes 110 is deflectable toward the cavity 136 in the base substrate. Each silicon electrode 110 includes an electrode lead 114 that is integrally formed with a mesa structure 112 that protrudes above the corresponding electrode lead 114. In an embodiment, each mesa structure 112 is approximately 15 μm tall, corresponding to the thickness of device layer 140 after the formation of mesa etch masks 144 described in further detail below, and the electrode leads 114 are approximately 5 μm thick. These dimensions are exemplary, and other dimensions are contemplated. A first insulating layer 124 is located on the spring support layer 150 to electrically insulate the patterned device layer 140 from the spring support layer 150. A second insulating layer 152 is located on the base substrate 130 to electrically insulate the spring support layer 150 from the base substrate 130. The silicon electrodes 110 form an electrode beam profile, and the spring support layer 150 forms a spring support layer beam profile underneath and supporting the electrode beam profile, where the spring support layer beam profile is wider than the supported electrode beam profile. Together, both the spring support layer beam profile and electrode beam profile are deflectable toward the cavity 136.

A via opening 120D may extend through the base substrate 130 from a backside of the base substrate. In the particular embodiment illustrated, via opening 120D terminates at a bottom surface of a second insulating layer 152 between the base substrate 130 and the spring support layer 150, and beneath where interconnect 106 is located. A via plug 135 is formed within the via opening 120D. With such a via plug configuration the via plug 135 is electrically isolated from the base substrate 130.

A top side via opening 120B may be formed over the backside via opening 120D. In the embodiment illustrated the top side via opening 120B is filled with top conductive contact 123. In the particular embodiment illustrated, top side via opening 120B is formed through the patterned device layer 140, spring support layer 150, and insulating layers 124, 152 in order for top conductive contact 123 to provide an electrical connection to plug 135. Collectively, openings 120A, 120B, 120C, 120D, conductive contacts 122, 123, and via plug 135 are referred to herein as via 120. In an embodiment, in addition to being formed within top side via openings 120B, top side conductive contact 123 is also formed on an exposed top surface of the silicon interconnect 106. In this manner, partially forming conductive contacts 123 over the top surface of the silicon interconnects 106 can provide greater surface area for ohmic contact with the silicon interconnects 106.

In an embodiment, via plug 135 is formed from the base substrate 130, and provides for an electrical connection with top conductive contact 123. In this manner, a first via plug 135 is electrically coupled to a first bus interconnect 106, and a second via plug 135 is electrically coupled to a second bus interconnect 106. In an embodiment, vias 120 contact one or more bus interconnects 106 in the patterned device layer 140. In other embodiments, vias 120 may contact other features or interconnects in the patterned silicon layer 140. Via 120 along line W-W may be electrically connected to a first bus interconnect 106 which is connected to a first voltage source $V_A$, and via 120 along line Y-Y may be electrically connected to a second bus interconnect 106 which is connected to a second voltage source $V_B$.

Still referring to FIG. 9, in an embodiment the first dielectric layer 118 is formed on top and side surfaces of the patterned device layer 140. The first dielectric layer 118 may additionally be formed on side surfaces of the via openings 120B. In this manner, the first dielectric layer 118 electrically insulates the top conductive contact 123. In an embodiment, the first dielectric layer 118 functions to provide the desired dielectric constant and/or dielectric breakdown strength, and resultant pick-up pressure of the compliant electrostatic transfer head. In an embodiment, first dielectric layer 118 is atomic layer deposition (ALD) $SiO_2$, $Al_2O_3$, $Ta_2O_5$, $HfO_2$, $Si_3N_4$, or $RuO_2$.

In another embodiment, an optional second dielectric layer 126 is formed over the first dielectric layer 118 to provide the desired capacitance. In such an optional arrangement, the first dielectric layer can provide alternative or additional functions, such as an etch protection layer. In such an embodiment, first dielectric layer 118 is formed of a nitride material. In an embodiment, the second dielectric layer 126 has a higher dielectric constant and/or dielectric breakdown strength than the first dielectric layer 118. In an embodiment, first dielectric layer 118 is a deposited silicon nitride ($SiN_x$), and second dielectric layer 126 is atomic layer deposition (ALD) $SiO_2$, $Al_2O_3$, $Ta_2O_5$, $HfO_2$, $Si_3N_4$, or $RuO_2$.

FIGS. 10-36 illustrate a method of forming a micro pick up array including an array of bipolar compliant electrostatic transfer head in accordance with an embodiment. Similar to FIG. 9, FIGS. 10-36 are combination cross-sectional side view illustrations taken along lines V-V, W-W, X-X, Y-Y, and Z-Z from FIG. 1A. Initially, the process may begin with preparing a base substrate and double SOI stacked wafer. FIGS. 10-12 are cross-sectional side view illustrations of a method of forming a base substrate with one or more cavities in an embodiment. Referring to FIG. 10, base substrate 130 may be formed of any suitable material for providing a supporting structure. Where via plugs 135 are to be formed from the base substrate 130, the base substrate is formed of a material capable of transferring charge. In an embodiment, base substrate is formed of a semiconductor wafer, such as a single crystalline, or polycrystalline silicon substrate. In an embodiment, base substrate 130 is a double side polished (DSP) silicon wafer. For example, base substrate may be a DSP (100) wafer having any suitable thickness, such as 500 µm+/−50 µm.

One or more cavities 136 are then formed within the base substrate 130 as illustrated in FIG. 11. Any suitable method may be used to form the one or more cavities 136, such as etching. In an embodiment, a silicon substrate 130 is etched using a timed dry reactive ion etching (DRIE). In an embodiment cavities are approximately 2 µm deep. Depth of cavities may be determined such that sufficient room is allowed for deflection of the compliant electrostatic transfer heads toward the cavity. Each bipolar compliant electrostatic transfer head may be deflectable toward a corresponding cavity, or a plurality of bipolar compliant electrostatic transfer heads may be deflectable toward a same cavity. The number, size, and shape of cavities 136 may be dependent upon particular design. For example, in one configuration a cavity 136 has a width of approximately 10 µm to 50 µm, and a length to support one or more bipolar compliant electrostatic transfer heads. For example, a length of 10 µm to 50 µm may support one bipolar compliant electrostatic transfer heads, with a larger length supporting more bipolar compliant electrostatic transfer heads. Following the formation of cavities 136, the substrate 130 is cleaned, and a thermal oxide may be growth on the top and bottom surfaces. For example, a thermally grown first insulating layer 152 and first back side passivation layer 132 are grown on the top and bottom surfaces, respectively, to a specified thickness such as 0.5 µm, for example. In an embodiment, first insulating layer 152 is formed on the top surface 131 of base substrate 130, sidewalls 137 of cavity 136, and the bottom surface 139 of the cavity 136. In an embodiment, first insulating layer 152 is a continuous layer, with uniform thickness and composition. For example, where base substrate 130 is formed of silicon, first insulating layer 152 is formed of $SiO_2$.

Referring to FIG. 13, in an embodiment, a double SOI wafer configuration is prepared for bonding to the patterned base substrate 130. The double SOI wafer configuration may include spring support layer 150 and device layer 140 grown on a handle substrate 142 to specified thicknesses for achieving specific spring characteristics and electrode configurations. In an exemplary embodiment, the double SOI wafer stack includes a 2 µm backside oxide ($SiO_2$) layer 143, a 500 µm silicon handle substrate 142, a 1 µm thick etch stop layer 141 (buried oxide, $SiO_2$), a 15 µm thick device layer 140 (silicon), a 1 µm thick second insulating layer 124 (buried oxide, $SiO_2$), and a 3 µm thick spring support layer 150 (silicon).

In an embodiment the double SOI wafer configuration of FIG. 13 is then bonded to the patterned base substrate as illustrated in FIG. 14. In this manner, the cavities 136 can be pre-patterned prior to patterning the spring support layer 150 and device layer 140. This may protect the integrity of the final spring support layer 150 and final device layer 140 by not requiring an under-etch after their formation to form the cavities 136. As illustrated in FIGS. 15-16, the spring support layer 150 may be fusion bonded to the insulating layer 152 to form a Si—$SiO_2$ fusion bond. Following wafer bonding, the oxide layer 143 is removed, for example using reactive ion etching (RIE) or grinding, followed by thinning of the handle substrate 142 using an etching or grinding technique. The final portion of the thinned handle substrate 142 may then be removed, using DRIE etching, for example, stopping on the etch stop layer 141.

Figure 18:
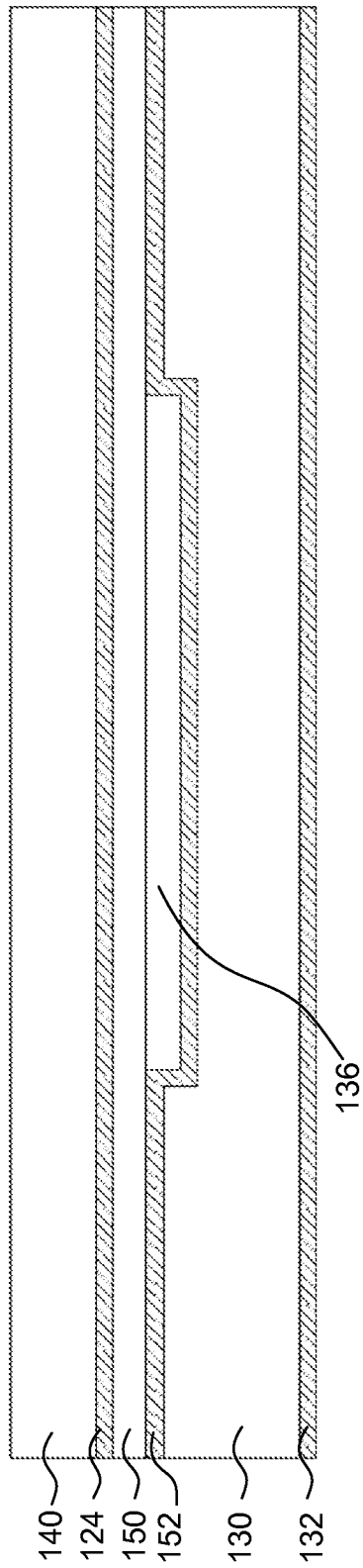

Following removal of the thinned handle substrate 142, the etch stop layer 141 is removed as illustrated in FIG. 18, exposing device layer 140. In one embodiment, the etch stop layer 141 is removed using a wet etching technique, such as a buffer oxide etch (BOE) chemistry. A BOE chemistry may be more selective than a DRIE technique, for example, allowing for a resultant uniform thickness of the device layer 140, from which the mesa structures 112 will be formed. In this manner, a controlled and uniform height of the compliant electrostatic transfer heads is achieved.

Figure 19:
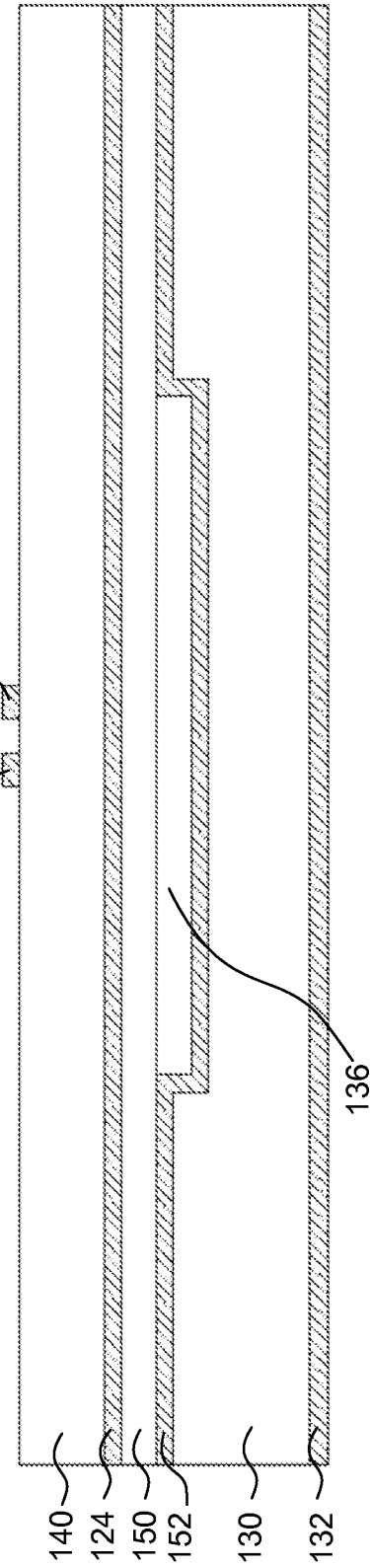
Figure 20:
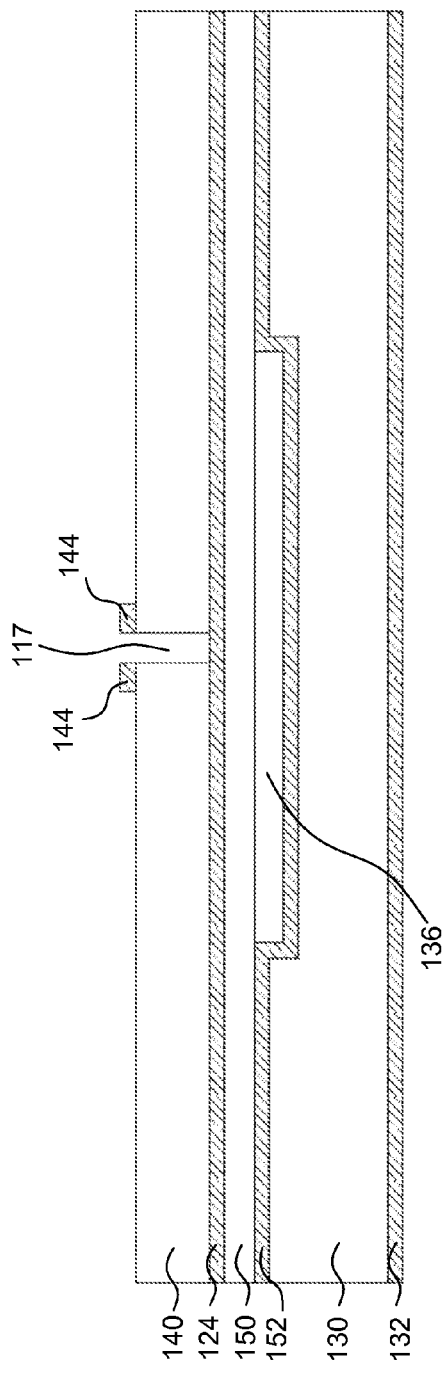

Referring to FIG. 19, a mesa etch mask 144 is formed on the device layer 140. In an embodiment, mesa etch mask 144 is formed by thermal oxidation ($SiO_2$) of the device layer 140, followed by reactive ion etching (RIE) stopping on the underlying device layer 140. In an embodiment, the mesa etch mask 144 is approximately 0.3 µm thick. Exemplary RIE etching chemistries may include fluorinated chemistries such as $CHF_3$, $CF_4$. Other suitable etching techniques of the thermal oxide include ion milling, plasma etching, reactive ion beam etching (RIBE), electron cyclotron resonance (ECR), or inductively coupled plasma (ICP). Following the formation of the mesa etch mask 144, any remaining patterned positive photoresist used may be removed using $O_2$ ashing flowing by piranha etch. An additional patterned positive photoresist may then be formed, with openings between the mesa etch mask 144 pairs, followed by DRIE etching of the device layer 140 to form trenches 117 between the mesa structures 112 of the silicon electrodes to be formed, stopping on the first insulting layer 124. In an embodiment, DRIE etching is performed using a fluorine based chemistry such as $SF_6$ or $C_4F_8$. Following the formation of trenches 117, any remaining patterned positive photoresist used may be removed using $O_2$ ashing flowing by piranha etch resulting in the structure illustrated in FIG. 20.

Figure 21:
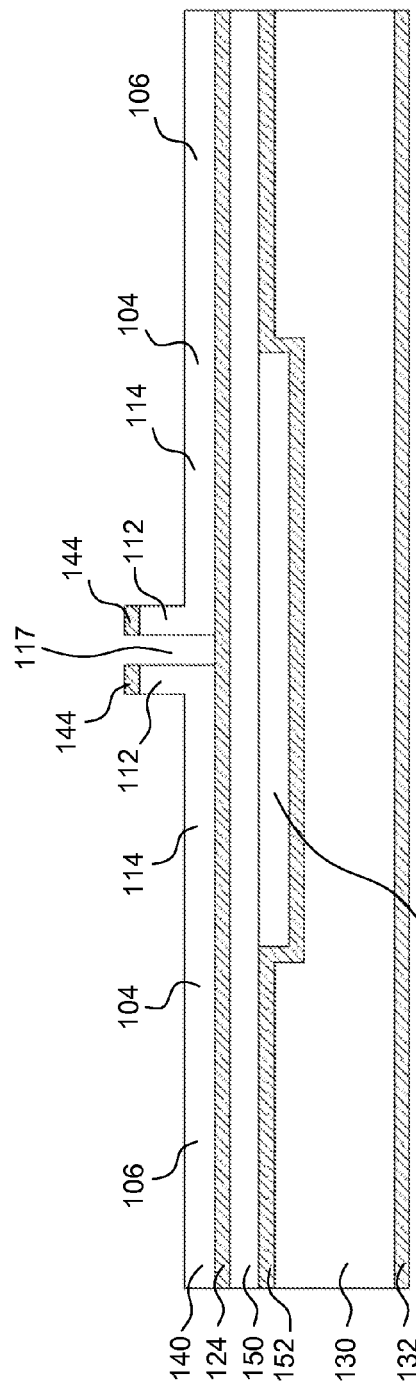

Referring to FIG. 21, the mesa etch masks 144 may remain, while the remainder of the device layer 140 is thinned down using a timed etch to achieve a resultant thickness of device layer 140 that will correspond to a thickness of the electrode leads 114 and interconnects 104, 106. $O_2$ plasma etching may then be performed to remove DRIE residue followed by a BOE etch for removal of the mesa etch masks 144, resulting in the structure illustrated in FIG. 22A. In an embodiment, a thickness or height ($EL_H$) of the thinned device layer 140 corresponding to the electrode leads 114 and interconnects 104, 106 is approximately 5 µm. In an embodiment, a height of the mesa structures 112 ($M_H$) is approximately 15 µm. In an embodiment, a membrane is formed over the cavity 136 at this stage that includes spring support layer 150, second insulating layer 124, and patterned device layer 140. In an embodiment, the total silicon thickness of the membrane at locations other than where the mesa structures 112 or trenches 117 are formed is approximately 8 µm (3 µm spring support layer 150, 5 µm patterned device layer 140).

Figure 22A:
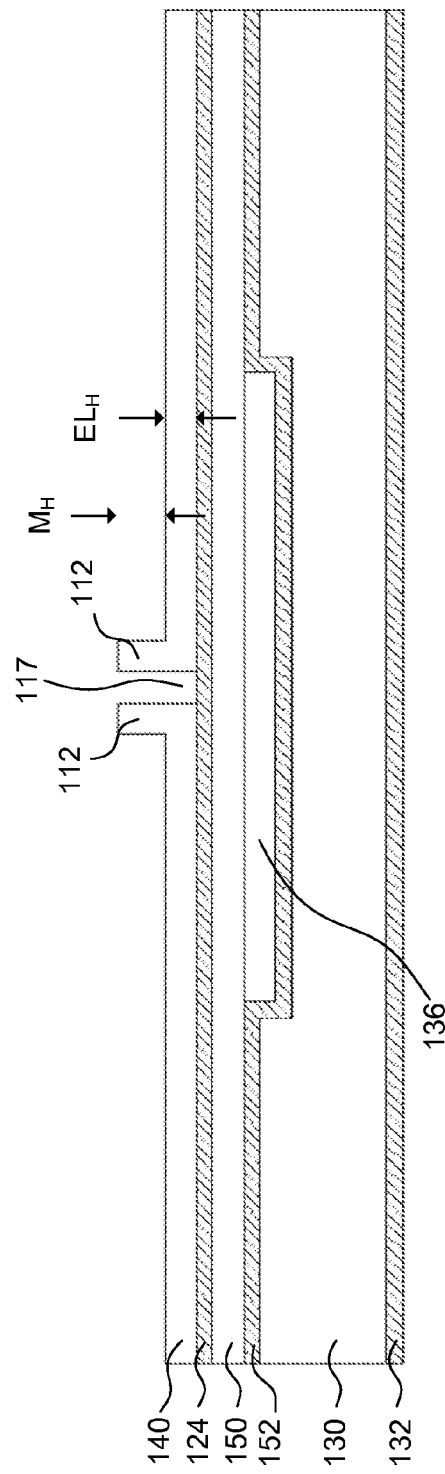
Figure 22B:
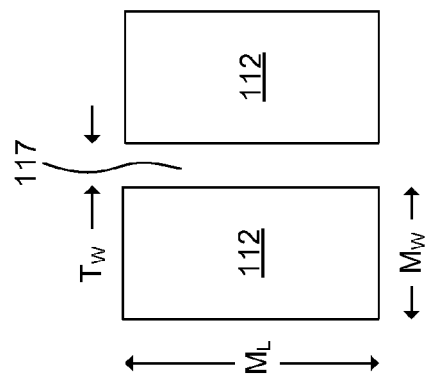

FIG. 22B is a schematic top view illustration of an exemplary mesa structure configuration in a bipolar compliant electrostatic transfer head in accordance with an embodiment. In the particular configuration illustrated, each bipolar compliant electrostatic transfer head has an approximate square contact surface. As such a mesa length ($M_L$) is approximately equal to the sum of two mesa widths ($M_W$) and a trench 117 width ($T_W$). The dimensions of the mesa structures 112 illustrated in FIG. 22B are approximately the same as the mesa etch masks 144 used to form the mesa structures 112. By way of example, for an exemplary 10 µm×10 µm electrostatic transfer head, each mesa structure 112 includes $M_W \times M_L$ dimensions of approximately 4.5 µm×10 µm, and a $T_W$ of approximately 1 µm. By way of example, for an exemplary 5 µm×5 µm electrostatic transfer head, each mesa structure 112 includes $M_W \times M_L$ dimensions of approximately 2.25 µm×5 µm, and a $T_W$ of approximately 0.5 µm. It is to be appreciated that these dimensions are exemplary, and that both larger and smaller dimensions are contemplated in accordance with embodiments.

Figure 23:
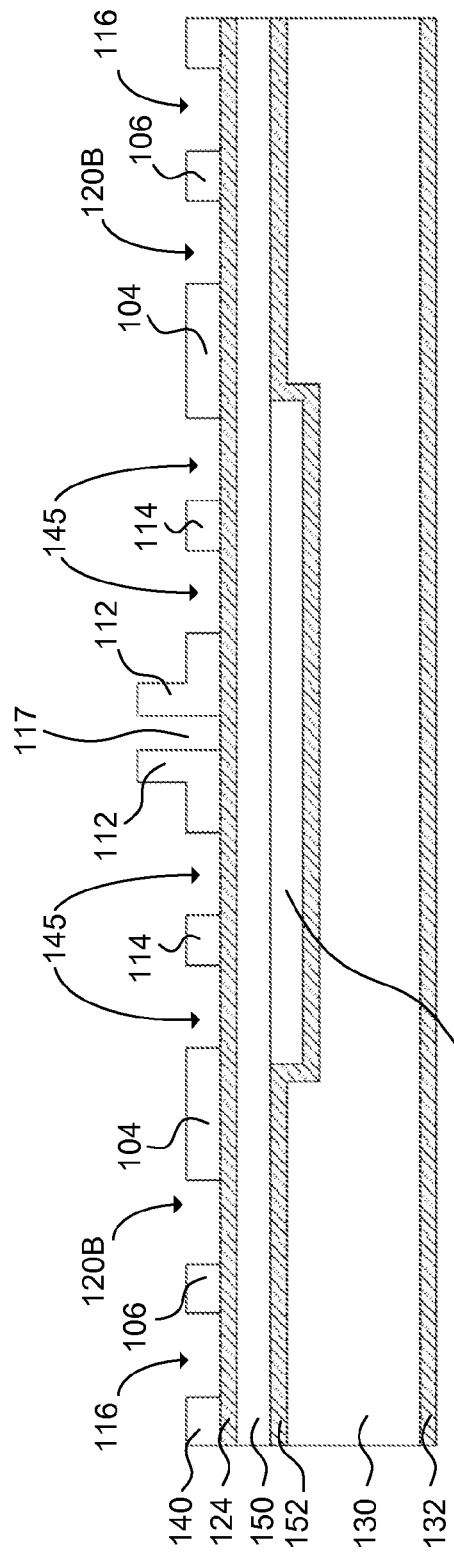
Figure 24:
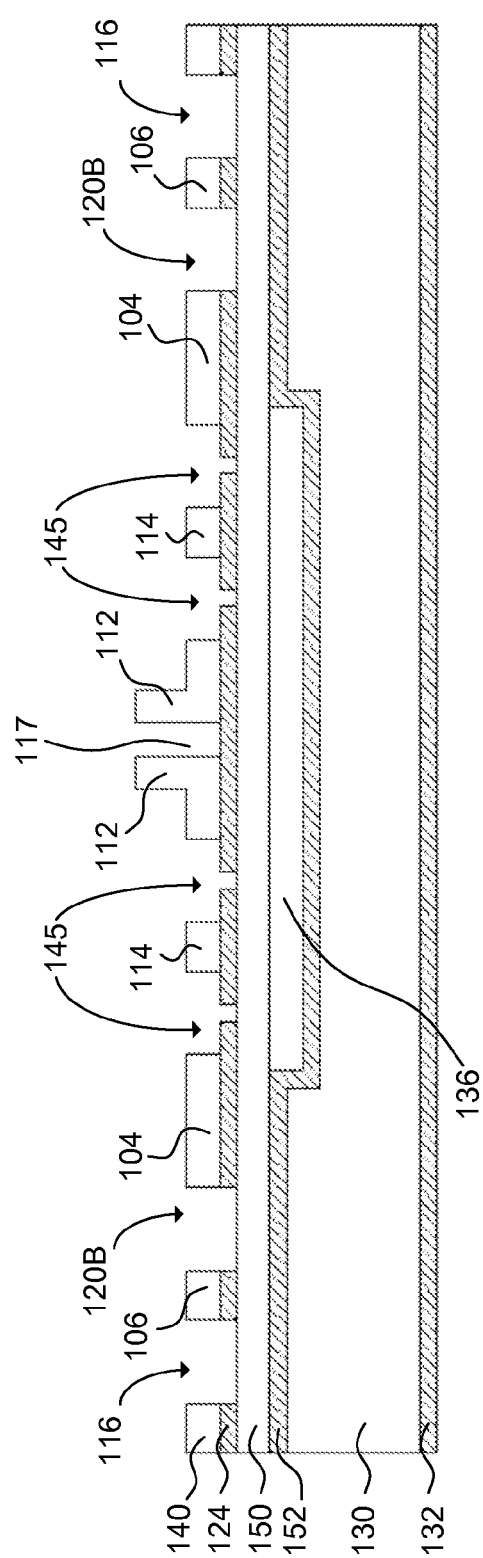

Referring now to FIG. 23 the device layer 140 is patterned. Specifically, the device layer is etched to form silicon interconnect 104, 106 and silicon electrode lead 114 profiles. As illustrated, beam profile openings 145 correspond to the electrode lead 114 patterns, and particularly the electrode beam profiles illustrated in FIG. 1A. Trenches 116 correspond to trenches 116 that partially define the silicon electrodes 110 and silicon interconnects 104, 106. Via openings 120B correspond to openings in the device layer 140 for providing an electrical connection to plug 135, yet to be formed. Via opening 120B is a portion of a collection of features referred to herein collective as via 120.

Following the patterning of trenches 116, via openings 120B, and beam profile opening 145 in the device layer 140, the trenches 116, via openings 120B, and beam profile opening 145 are etched though the first insulating layer 124 using a suitable technique, such as RIE using a fluorine based chemistry such as $CF_4$ or $CHF_3$. In the particular embodiment illustrated in FIG. 24, beam profile opening 145 through the device layer 140 are wider than the beam profile opening 145 through the first insulating layer 124. This may be attributed to using separate masks for patterning of the device layer 140 and first insulating layer 124. As illustrated in FIG. 23, the first insulating layer 124 is not etched underneath trenches 117.

Referring now to FIGS. 25-26, following etching of the first insulating layer 124, openings 120B are etched through the spring support layer 150 using a suitable etching techniques such as DRIE (e.g. $SF_6$ chemistry) followed by etching through the second insulating layer 152 using a suitable etching technique such as RIE (e.g. $CF_4$ or $CHF_3$ chemistry), stopping on the base substrate 130. In an embodiment, the same etching mask is used for etching through both the spring support layer 150 and the second insulating layer 152.

Figure 27:
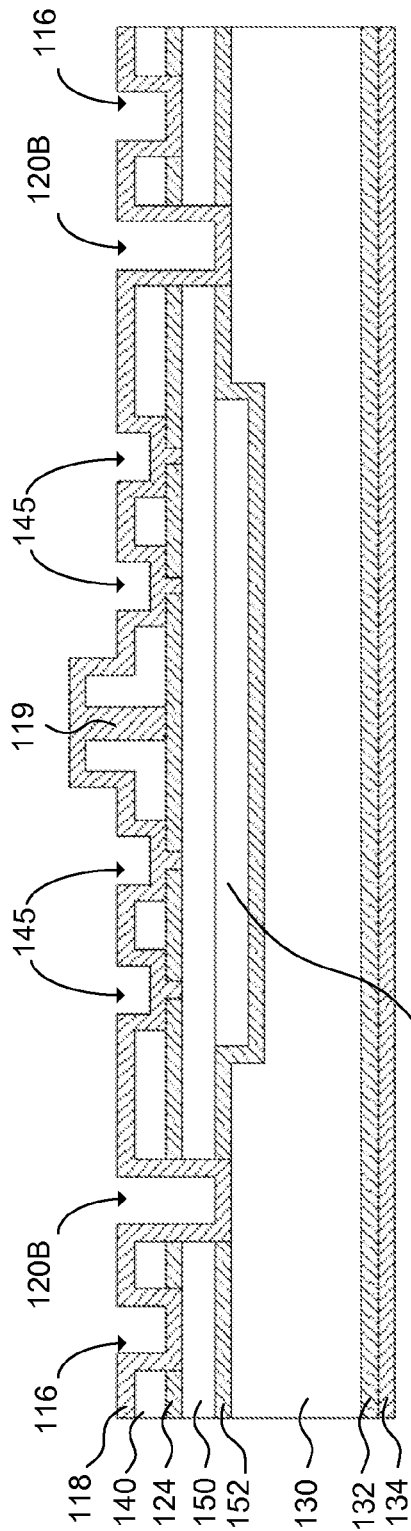
Figure 28:
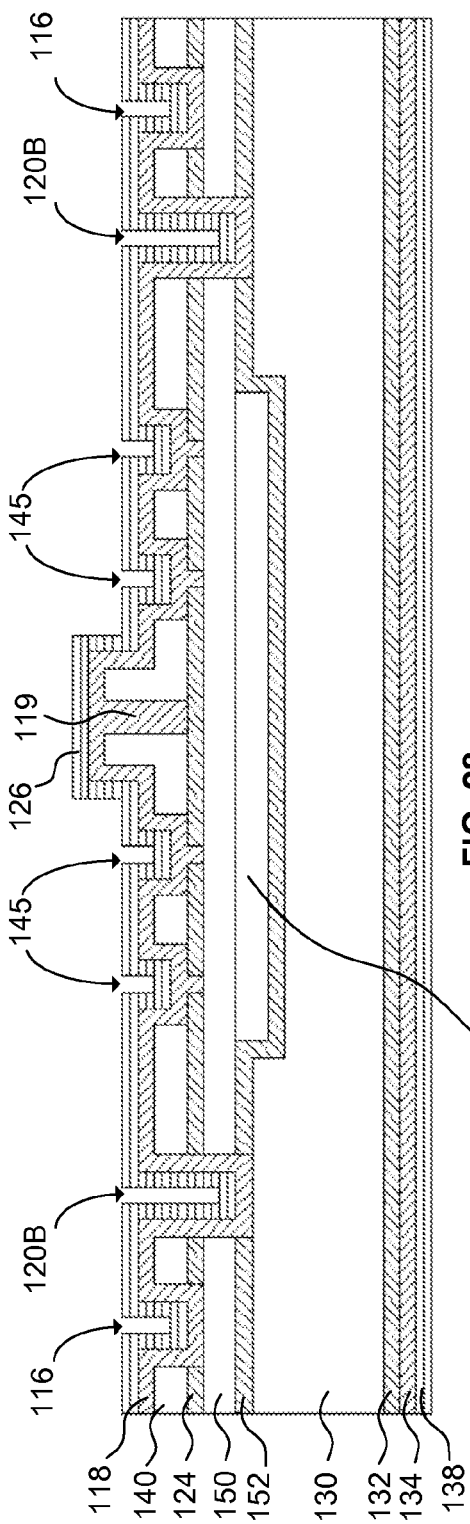

Referring now to FIGS. 27-28 a first dielectric layer 118 and optionally a second dielectric layer 126 are formed over the patterned device layer 140. Formation of dielectric layers 118, 126 may also simultaneously form backside passivation layers 134, 138, respectively. Depending upon the particular configuration, first dielectric layer 118 can perform a variety of functions. In one application, first dielectric layer can be used to provide the desired dielectric constant and/or dielectric breakdown strength, and resultant pick-up pressure of the electrostatic transfer head. In an embodiment, first dielectric layer 118 is atomic layer deposition (ALD) $SiO_2$, $Al_2O_3$, $Ta_2O_5$, $HfO_2$, $Si_3N_4$, or $RuO_2$. In an embodiment, first dielectric layer 118 is an approximately 5,000 angstrom thick ALD $Al_2O_3$ layer. In an embodiment, first dielectric layer 118 fills trench 117 between mesa structures 119 and provides a dielectric joint 119 between and connecting the pair of silicon electrodes 110. Such a dielectric joint 119 may provide additional mechanical stability to the electrode design.

In an embodiment, first dielectric layer 118 can be used as an etch protection layer when a second dielectric layer 126 is formed over the first dielectric layer. While a second dielectric layer 126 is illustrated and described, it is understood that the second dielectric layer 126 is optional. In an embodiment, first dielectric layer is a nitride layer. For example, first dielectric layer 118 may be an approximately 500 angstrom thick $SiN_x$ layer. In such an embodiment, second dielectric layer 126 is deposited over the first dielectric layer to provide the desired dielectric constant and/or dielectric breakdown strength, and resultant pick-up pressure of the electrostatic transfer head. In an embodiment, second dielectric layer 126 is atomic layer deposition (ALD) $SiO_2$, $Al_2O_3$, $Ta_2O_5$, $HfO_2$, $Si_3N_4$, or $RuO_2$. In an embodiment, second dielectric layer 126 is an approximately 5,000 angstrom thick ALD $Al_2O_3$ layer. In an embodiment, a combination of the first and second dielectric layers 118, 126 fill trench 117 and form dielectric joint 119.

In accordance with embodiments, the formation of first dielectric layer 118 may also simultaneously form second back side passivation layer 134, characterized by the same composition and thickness as the first dielectric layer 118. Likewise, the optional formation of second dielectric layer 126 may also simultaneously form optional third back side passivation layer 138, characterized by the same composition and thickness as the second dielectric layer 126.

Figure 29:
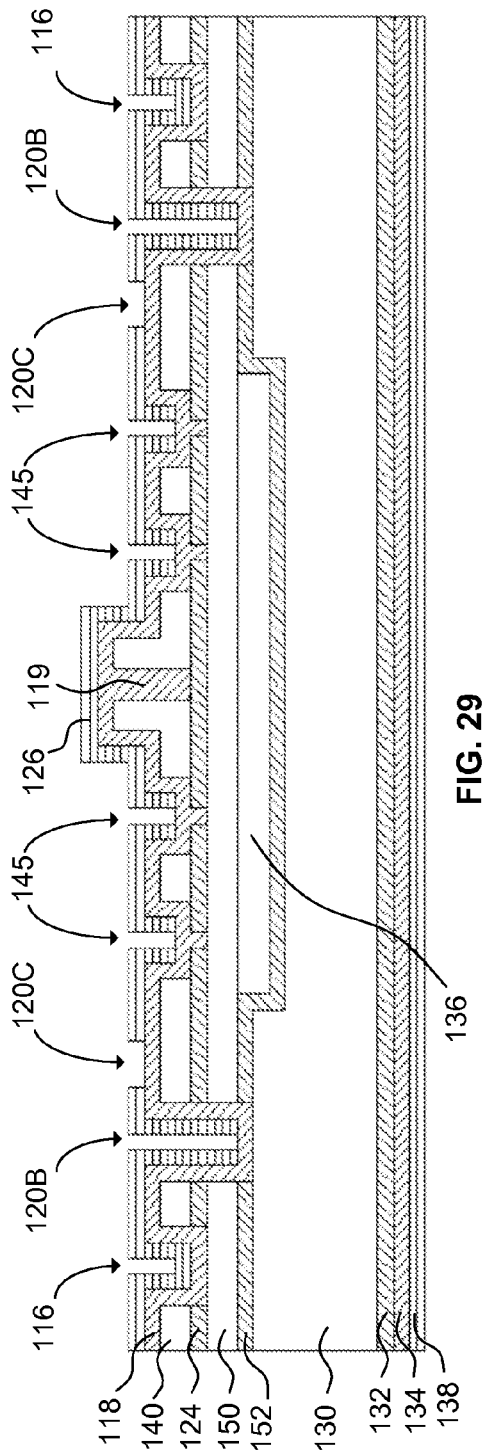
Figure 30:
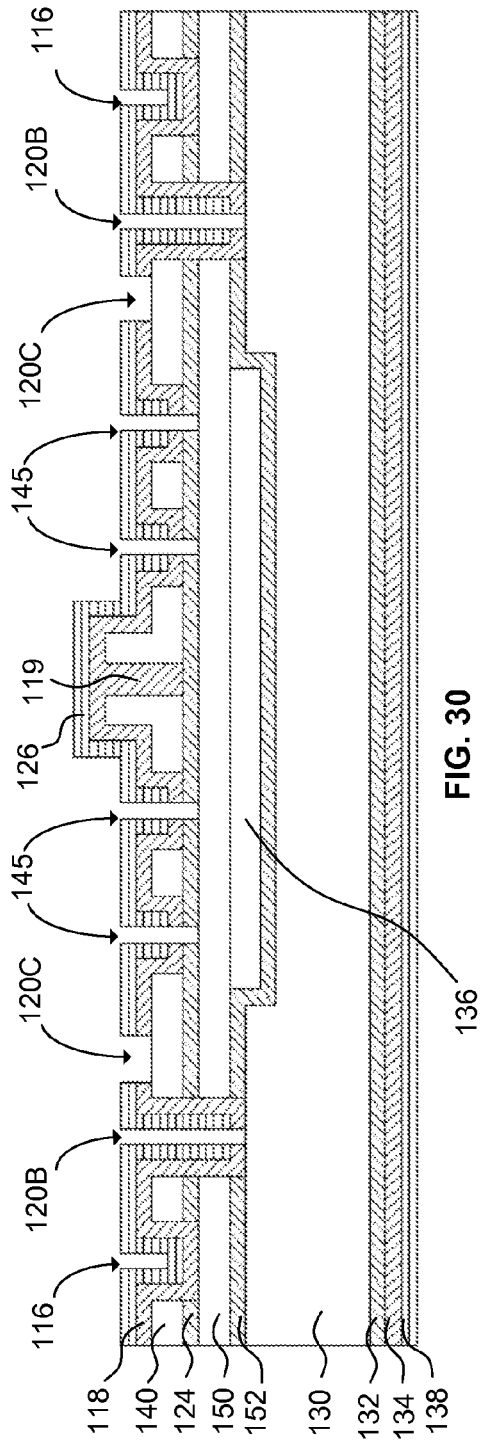

Whether a first dielectric layer 118, or first and second dielectric layers 118, 126 are formed, the dielectric layer(s) may be formed over the patterned device layer 140, and within the trenches 116, 117, via openings 120B, and beam profile opening 145. In this manner, the dielectric layer(s) provide electrical insulation. For example, the dielectric layer(s) may provide electrical insulation within the via opening 120B. Referring now to FIGS. 29-30 via openings 120B, contact openings 120C, and beam profile opening 145 are formed through the first dielectric layer 118, and optional second dielectric layer 126, stopping on the base substrate 130 (for via opening 120B), patterned device layer 140 (for via opening 120C), and spring support layer 150 (for beam profile opening 145). Referring briefly back to FIG. 1A, in an embodiment, contact openings 120C are located above bus interconnects 106. In the particular embodiment illustrated in FIGS. 29-30 including a $SiN_x$ first dielectric layer 118 and $Al_2O_3$ second dielectric layer 126, the second dielectric layer 126 is etched within via openings 120B, contact openings 120C, and beam profile openings 145 using a suitable etching chemistry such as $Cl_2$ RIE, stopping on the first dielectric layer 118. In such an embodiment, the underlying $SiN_x$ first dielectric layer 118 may protect the underlying silicon layers 130, 140, 150 against the potential for forming volatile chlorides, and preserve the integrity of the silicon layers. Following etching of the second dielectric layer 126, a short $O_2$ plasma clean may be performed, followed by etching of the first dielectric layer 118 using a suitable etching chemistry such as a fluorine based RIE (e.g. $CHF_3$, $CF_4$), stopping on the underlying silicon layers 130, 140, 150.

In an alternative embodiment, a second dielectric layer 126 is not formed. In such an embodiment, the first dielectric layer 118 may be formed of a material such as (ALD) $SiO_2$, $Al_2O_3$, $Ta_2O_5$, $HfO_2$, $Si_3N_4$, or $RuO_2$. For example, first dielectric layer 118 may be ALD $Al_2O_3$. In such an embodiment, via openings 120B, contact openings 120C, and beam profile openings 145 are etched in the first dielectric layer 118 to expose the underlying base substrate 130, patterned device layer 140, and spring support layer 150 using a suitable etching chemistry such as a fluorine based RIE (e.g. $CHF_3$, $CF_4$), stopping on the underlying silicon layers 130, 140, 150. Following etching of the second dielectric layer(s) an $O_2$ plasma and solvent wet clean may be performed to remove any residues and photoresist used for patterning.

Figure 31:
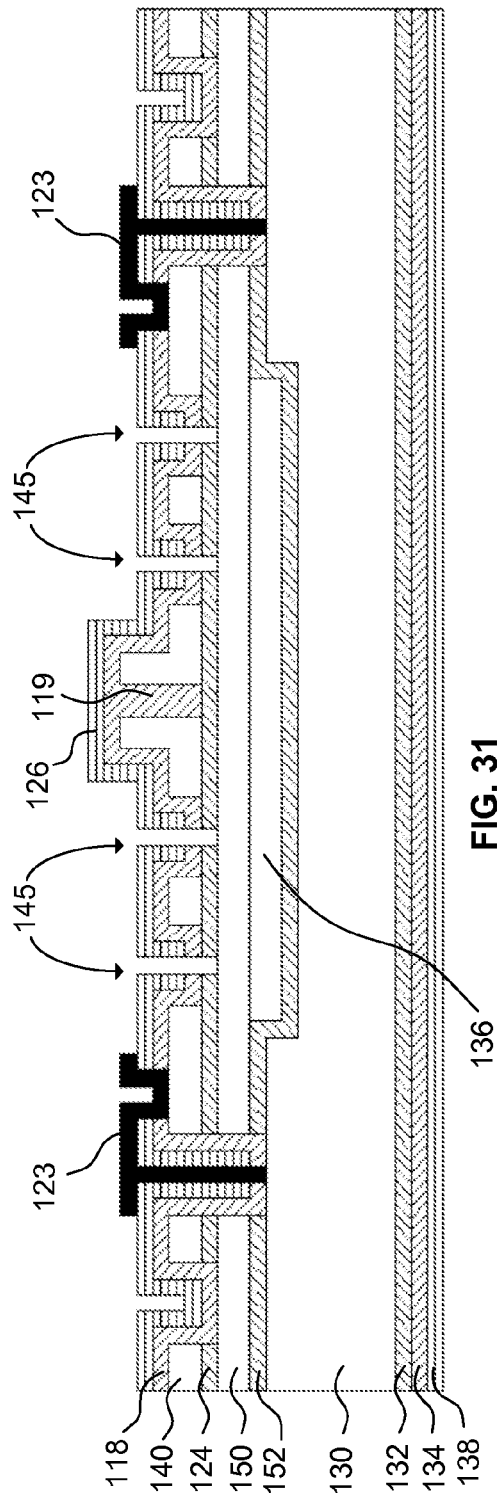

Referring now to FIG. 31, a top conductive contact 123 is formed within each via opening 120B to make electrical contact with the base substrate 130. In the particular embodiment illustrated, top conductive contact 123 also spans along a top surface of the dielectric layer(s) and is formed within contact opening 120C and on bus electrode 106. In this manner, each top conductive contact 123 provides an electric path from a bus electrode 106 to the base substrate 130. In an embodiment, top conductive contacts 123 include a TiW and Au stack. In an embodiment, top conductive contacts 123 are formed of about 500 to 1,000 angstroms TiW followed by 1,000 to 5,000 angstroms Au. Top conductive contacts may be formed by any suitable method such as sputtering.

Figure 32:
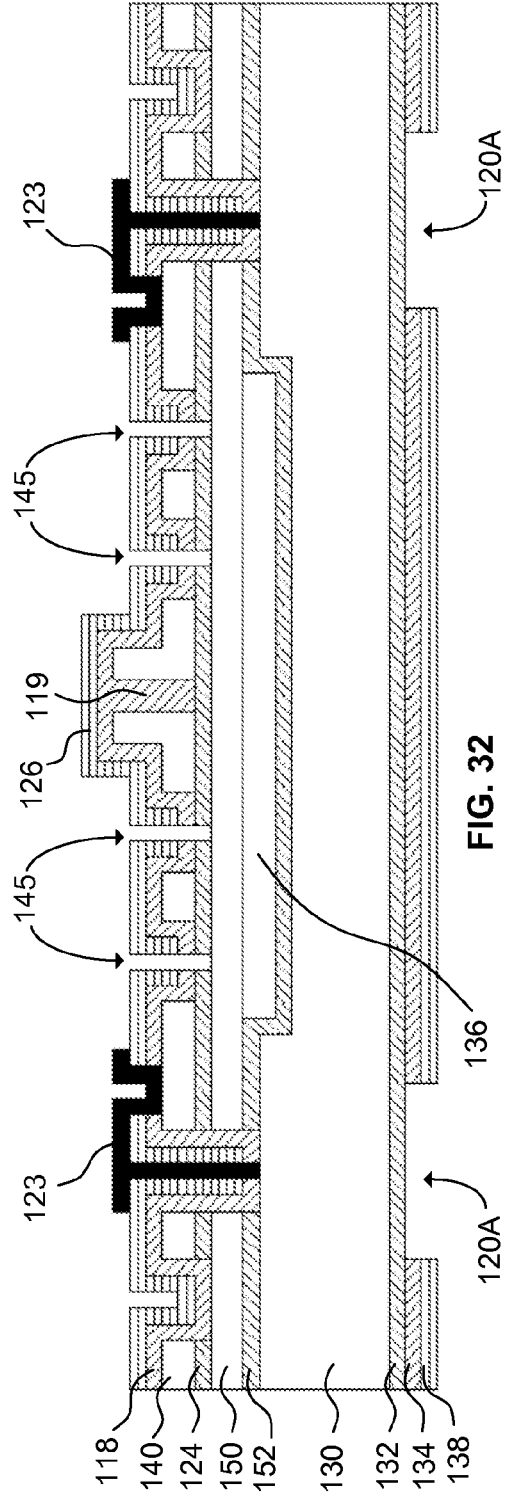

FIGS. 32-35 illustrate a manner of forming via plugs in the base substrate 130, in accordance with an embodiment. As illustrated in FIG. 32, via openings 120A are formed through the back side passivation layers 138, 134 using a suitable technique such as ion milling or RIE, stopping on the back side passivation layer 132. As illustrated in FIG. 33, via opening 120A is etched through back side passivation layer 132 using a suitable technique such as a BOE or RIE to contact the base substrate 130. Following etching through the passivation layers to contact the base substrate 130, the back side of the SOI stack is $O_2$ plasma and solvent cleaned to remove any photoresist, and the base substrate 130 may be pre-cleaned with an Ar plasma clean. Referring now to FIG. 34 back side conductive contacts 122 are formed on the exposed base substrate 130 within via openings 120A. In an embodiment, back side conductive contacts 122 include a TiW and Au stack. In an embodiment, back side conductive contacts 122 are formed of about 500 to 1,000 angstroms TiW followed by 1,000 to 5,000 angstroms Au. Back side conductive contacts may be formed by any suitable method such as sputtering.

Following the formation of back side conductive contacts 122, the back side of the SOI stack is $O_2$ plasma and solvent cleaned to remove any photoresist, and the base substrate 130 is etched to form via openings 120D through the base substrate 130. In the particular embodiment illustrated in FIG. 35, via openings 120D terminate at a bottom surface of a second insulating layer 152 between the base substrate 130 and the spring support layer 150, and beneath where bus interconnect 106 is located. As a result a via plug 135 is formed within the via opening 120D. With such a via plug configuration, via plug 135 is electrically isolated from the base substrate 130. In an embodiment, via openings 120D are etched using a suitable etching technique such as DRIE with a fluorine based chemistry such as $SF_6$. Following the formation of via plugs 135, the back side of the SOI stack is $O_2$ plasma and solvent cleaned to remove any photoresist.

Referring now to FIG. 36, a spring release etch operation is performed in accordance with embodiments. Up until this point the spring support layer 150 entirely covers each cavity 136. Referring to FIG. 36, the beam profile opening 145 are now etched through the spring support layer 150 to expose the one or more cavities 136 and release the electrode beam profiles of the silicon electrodes and the spring support layer beam profiles of the spring support layer 150. This results in the spring support layer 150 spring support layer beam profile underneath and supporting the electrode beam profile over the cavity 136. In an embodiment, the spring release etch operation is performed using a time DRIE technique using a fluorine based chemistry such as $SF_6$ or $C_4F_8$. In an embodiment, the spring release etch operation is performed using a gas phase $XeF_2$ etch. Following the spring release etch operation the SOI stack is $O_2$ plasma and solvent cleaned to remove any photoresist. The SOI stack may then be diced if multiple micro pick up arrays are to be singulated from the same SOI stack.

Figure 37:
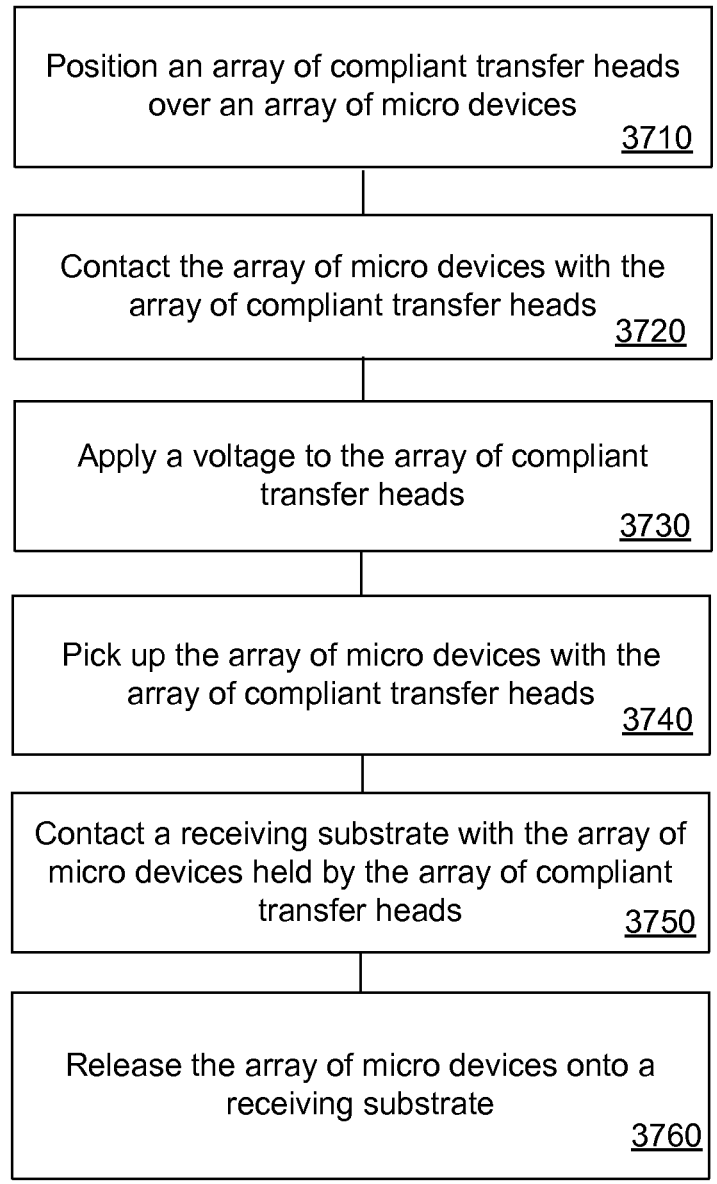
FIG. 37 is a flow chart illustrating a method of picking up and transferring an array of micro devices from a carrier substrate to a receiving substrate in accordance with an embodiment.
Figure 42:
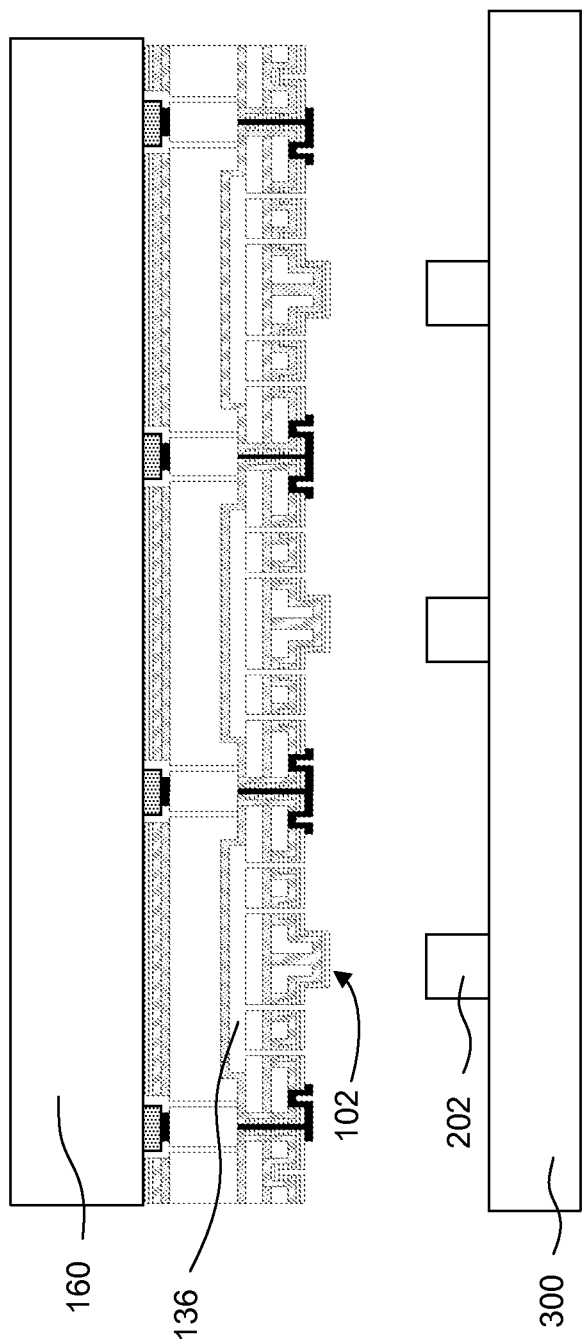
FIG. 42 is a cross-sectional side view illustration of an array of micro devices released onto a receiving substrate in accordance with an embodiment.

FIG. 37 is a flow chart illustrating a method of picking up and transferring an array of micro devices from a carrier substrate to a receiving substrate in accordance with an embodiment. At operation 3710 a micro pick up array including an array of bipolar compliant electrostatic transfer heads is positioned over an array of micro devices on a carrier substrate. FIG. 38 is a cross-sectional side view illustration of an array of bipolar compliant electrostatic transfer heads 102 positioned over an array of micro devices on a carrier substrate 200 in accordance with an embodiment. At operation 3720 the array of micro devices are contacted with the array of bipolar compliant electrostatic transfer heads. In an alternative embodiment, the array of bipolar compliant electrostatic transfer heads is positioned over the array of micro devices with a suitable air gap separating them which does not significantly affect the grip pressure, for example, 1 nm to 10 nm. FIG. 39 is a cross-sectional side view illustration of an array of bipolar compliant electrostatic transfer heads 102 in contact with an array of micro devices 202 in accordance with an embodiment. As illustrated, the pitch of the array of bipolar compliant electrostatic transfer heads 102 is an integer multiple of the pitch of the array of micro devices 202. At operation 3730 a voltage is applied to the array of bipolar compliant electrostatic transfer heads 102. The voltage may be applied from the working circuitry within a transfer head assembly 160 in electrical connection with the array of bipolar compliant electrostatic transfer heads through vias 120. At operation 3740 the array of micro devices is picked up with the array of bipolar compliant electrostatic transfer heads. FIG. 40 is a cross-sectional side view illustration of an array of bipolar compliant electrostatic transfer heads 102 picking up an array of micro devices 202 in accordance with an embodiment. At operation 3750 the array of bipolar compliant electrostatic transfer heads contacts the receiving substrate with the array of micro devices 202. FIG. 41 is a cross-sectional side view illustration of contacting a receiving substrate with an array of micro devices held by an array of bipolar compliant electrostatic transfer heads in accordance with an embodiment. At operation 3760 the array of micro devices is then released onto a receiving substrate. For example, the receiving substrate may be, but is not limited to, a display substrate, a lighting substrate, a substrate with functional devices such as transistors or ICs, or a substrate with metal redistribution lines. FIG. 42 is a cross-sectional side view illustration of an array of micro devices 202 released onto a receiving substrate 300 in accordance with an embodiment.

While operations 3710-3760 have been illustrated sequentially in FIG. 37, it is to be appreciated that embodiments are not so limited and that additional operations may be performed and certain operations may be performed in a different sequence. For example, in one embodiment, an operation is performed to create a phase change in a bonding layer connecting the micro device to the carrier substrate prior to or while picking up the micro device. For example, the bonding layer may have a liquidus temperature less than 350° C., or more specifically less than 200° C. The bonding layer may be formed of a material which provides adhesion to the carrier substrate, yet also a medium from which the micro device is readily releasable. In an embodiment, the bonding layer is a material such as indium or an indium alloy. If a portion of the bonding layer is picked up with the micro device, additional operations can be performed to control the phase of the portion of the bonding layer during subsequent processing. For example, heat can be applied to the bonding layer from a heat source located within the transfer head assembly 160, carrier substrate 200, and/or receiving substrate 300.

Furthermore, operation 3730 of applying the voltage to create a grip pressure on the micro devices can be performed in various orders. For example, the voltage can be applied prior to contacting the array of micro devices with the array of compliant electrostatic transfer heads, while contacting the micro devices with the array of bipolar compliant electrostatic transfer heads, or after contacting the micro devices with the array of bipolar compliant electrostatic transfer heads. The voltage may also be applied prior to, while, or after creating a phase change in the bonding layer.

Where the bipolar compliant electrostatic transfer heads 102 include bipolar silicon electrodes, an alternating voltage is applied across the pair of silicon electrodes in each compliant electrostatic transfer head 102 so that at a particular point when a negative voltage is applied to one silicon electrode, a positive voltage is applied to the other silicon electrode in the pair, and vice versa to create the pickup pressure. Releasing the micro devices from the compliant electrostatic transfer heads 102 may be accomplished with a varied of methods including turning off the voltage sources, lowering the voltage across the pair of silicon electrodes, changing a waveform of the AC voltage, and grounding the voltage sources. Release may also be accomplished by discharge associated with placing the micro devices on the receiving substrate.

In utilizing the various aspects of this invention, it would become apparent to one skilled in the art that combinations or variations of the above embodiments are possible for forming a bipolar compliant electrostatic transfer head and head array, and for transferring a micro device and micro device array. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A compliant electrostatic transfer head structure comprising:
    a base substrate;
    a cavity completely in the base substrate;
    a spring support layer on the base substrate, wherein the spring support layer includes a spring support layer beam profile that extends over the cavity from a first side of the cavity to a second side of the cavity and is deflectable toward the cavity;
    a first insulating layer on the spring support layer; and
    a patterned device layer on the spring support layer, wherein the patterned device layer includes an electrode beam profile that is supported by the spring support layer beam profile and extends over the cavity from the first side of the cavity to the second side of the cavity and is deflectable toward the cavity.

2. The compliant electrostatic transfer head structure of claim 1, wherein the first insulating layer electrically insulates the patterned device layer from the spring support layer.

3. The compliant electrostatic transfer head structure of claim 1, wherein the electrode beam profile of the patterned device layer comprises a pair of electrodes, and the pair of electrodes includes a first electrode lead integrally formed with a first mesa structure protruding above the first electrode lead, and a second electrode lead integrally formed with a second mesa structure protruding above the second electrode lead.

4. The compliant electrostatic transfer head structure of claim 3, further comprising a second insulating layer between the base substrate and the spring support layer, wherein the second insulating layer electrically insulates the spring support layer from the base substrate.

5. The compliant electrostatic transfer head structure of claim 4, wherein the second insulating layer spans along a top surface of the base substrate, sidewalls of the cavity, and a bottom surface of the cavity.

6. The compliant electrostatic transfer head structure of claim 3, wherein the patterned device layer further comprises a first trace interconnect integrally formed with the first electrode, and a second trace interconnect integrally formed with the second electrode.

7. The compliant electrostatic transfer head structure of claim 6, wherein the patterned device layer is formed of silicon.

8. The compliant electrostatic transfer head structure of claim 6, further comprising:
    a first via in the base substrate and a first plug within the first via, the first plug electrically coupled to the first trace interconnect and the first electrode lead; and
    a second via in the base substrate and a second plug within the second via, the second plug electrically coupled to the second trace interconnect and the second electrode lead.

9. The compliant electrostatic transfer head structure of claim 6, wherein the electrode beam profile extends between the first and second trace interconnects.

10. The compliant electrostatic transfer head structure of claim 9, wherein the spring support layer beam profile extends between the first and second trace interconnects, and the spring support layer beam profile is wider than the electrode beam profile.

11. The compliant electrostatic transfer head structure claim 9, wherein the each of the first and second electrodes comprises a double bend.

12. The compliant electrostatic transfer head structure of claim 11, wherein the electrode beam profile is characterized by an S-shape configuration.

13. The compliant electrostatic transfer head structure claim 3, wherein the first and second mesa structures are separated by trench characterized by a width of 1.0 µm or less.

14. The compliant electrostatic transfer head structure of claim 13, wherein the trench is filled with a dielectric material.

15. The compliant electrostatic transfer head structure of claim 1, further comprising a second insulating layer directly on and spanning along a top surface of the base substrate, sidewalls of the cavity, and a bottom surface of the cavity, wherein the second insulating layer electrically insulates the spring support layer from the base substrate.

16. The compliant electrostatic transfer head of claim 15, wherein the electrode beam profile of the patterned device layer comprises a pair of electrodes, and the pair of electrodes includes a first electrode lead integrally formed with a first mesa structure protruding above the first electrode lead, and a second electrode lead integrally formed with a second mesa structure protruding above the second electrode lead.

17. The compliant electrostatic transfer head of claim 16, wherein the patterned device layer further comprises a first trace interconnect integrally formed with the first electrode lead, and a second trace interconnect integrally formed with the second electrode lead.

18. The compliant electrostatic transfer head of claim 15, wherein the base substrate comprises silicon, and the second insulating layer comprises silicon oxide.

19. The compliant electrostatic transfer head of claim 18, wherein the spring layer comprises silicon.

20. The compliant electrostatic transfer head of claim 18, wherein the first insulating layer comprises silicon oxide, and the patterned device layer comprises silicon.

* * * * *